(12) United States Patent
Lin et al.

(10) Patent No.: US 11,862,468 B2
(45) Date of Patent: Jan. 2, 2024

(54) SEMICONDUCTOR DEVICE AND METHOD

(71) Applicant: Taiwan Semiconductor Manufacturing Co., Ltd., Hsinchu (TW)

(72) Inventors: Kuei-Lun Lin, Keelung (TW); Chia-Wei Hsu, New Taipei (TW); Xiong-Fei Yu, Hsinchu (TW); Chi On Chui, Hsinchu (TW); Chih-Yu Hsu, Xinfeng Township (TW); Jian-Hao Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 222 days.

(21) Appl. No.: 17/162,270

(22) Filed: Jan. 29, 2021

(65) Prior Publication Data

US 2022/0246433 A1 Aug. 4, 2022

(51) Int. Cl.
*H01L 21/28* (2006.01)
*H01L 21/8234* (2006.01)
(Continued)

(52) U.S. Cl.
CPC .. *H01L 21/28185* (2013.01); *H01L 21/28525* (2013.01); *H01L 21/32055* (2013.01);
(Continued)

(58) Field of Classification Search
CPC ......... H01L 21/28185; H01L 21/28525; H01L 21/32055; H01L 21/823431;
(Continued)

(56) References Cited

U.S. PATENT DOCUMENTS

2006/0022262 A1  2/2006  Yoon et al.
2009/0075490 A1*  3/2009  Dussarrat ............ H01L 21/0228
                                                         257/E21.24
(Continued)

FOREIGN PATENT DOCUMENTS

KR  20150141433 A  12/2015
KR  20170051952 A   5/2017
(Continued)

OTHER PUBLICATIONS

Oviroh et al., "New development of atomic layer deposition: processes, methods and applications," Science and Technology of Advanced Materials 2019, vol. 20, No. 1, Accepted Mar. 22, 2019, pp. 465-496.

*Primary Examiner* — Ali Naraghi
*Assistant Examiner* — Siangluai Mang
(74) *Attorney, Agent, or Firm* — Slater Matsil, LLP

(57) ABSTRACT

In an embodiment, a method includes: depositing a gate dielectric layer on a first fin and a second fin, the first fin and the second fin extending away from a substrate in a first direction, a distance between the first fin and the second fin decreasing along the first direction; depositing a sacrificial layer on the gate dielectric layer by exposing the gate dielectric layer to a self-limiting source precursor and a self-reacting source precursor, the self-limiting source precursor reacting to form an initial layer of a material of the sacrificial layer, the self-reacting source precursor reacting to form a main layer of the material of the sacrificial layer; annealing the gate dielectric layer while the sacrificial layer covers the gate dielectric layer; after annealing the gate dielectric layer, removing the sacrificial layer; and after removing the sacrificial layer, forming a gate electrode layer on the gate dielectric layer.

20 Claims, 23 Drawing Sheets

(51) Int. Cl.
*H01L 27/088* (2006.01)
*H01L 21/3205* (2006.01)
*H01L 21/285* (2006.01)
*H01L 29/66* (2006.01)
*H01L 21/8238* (2006.01)
*H01L 27/092* (2006.01)
*H01L 21/3213* (2006.01)

(52) U.S. Cl.
CPC .............. *H01L 21/823431* (2013.01); *H01L 21/823821* (2013.01); *H01L 27/0886* (2013.01); *H01L 27/0924* (2013.01); *H01L 29/66545* (2013.01); *H01L 29/66795* (2013.01); *H01L 21/32051* (2013.01); *H01L 21/32134* (2013.01); *H01L 21/32135* (2013.01)

(58) Field of Classification Search
CPC ......... H01L 21/823821; H01L 27/0886; H01L 27/0924; H01L 29/66545; H01L 29/66795
See application file for complete search history.

(56) References Cited

U.S. PATENT DOCUMENTS

| | | | |
|---|---|---|---|
| 2015/0060959 A1 | 3/2015 | Lin et al. | |
| 2015/0187659 A1* | 7/2015 | Nandakumar | H01L 29/6659 438/587 |
| 2015/0357426 A1 | 12/2015 | Kim et al. | |
| 2017/0054020 A1* | 2/2017 | Kim | H01L 29/7846 |
| 2017/0125597 A1 | 5/2017 | Kim et al. | |
| 2018/0082909 A1 | 3/2018 | Adusumilli et al. | |
| 2018/0096898 A1* | 4/2018 | Yu | H01L 21/3247 |
| 2018/0151564 A1* | 5/2018 | Lee | H01L 29/66795 |
| 2019/0103476 A1 | 4/2019 | Yu et al. | |
| 2019/0148151 A1* | 5/2019 | Okuno | H01L 29/66545 257/401 |
| 2019/0148216 A1* | 5/2019 | Shin | H01L 21/76202 438/254 |
| 2019/0311942 A1* | 10/2019 | Cheng | H01L 29/78642 |
| 2019/0319113 A1 | 10/2019 | Yu et al. | |
| 2020/0105605 A1 | 4/2020 | Teng et al. | |
| 2020/0395462 A1* | 12/2020 | Lin | H01L 29/66795 |

FOREIGN PATENT DOCUMENTS

| | | |
|---|---|---|
| KR | 20200063118 A | 6/2020 |
| TW | 201916115 A | 4/2019 |
| TW | 201944492 A | 11/2019 |
| TW | 202013468 A | 4/2020 |

* cited by examiner

SEMICONDUCTOR DEVICE AND METHOD

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 10A through 22B are cross-sectional views of intermediate stages in the manufacturing of FinFETs, in accordance with some embodiments.

DETAILED DESCRIPTION

Figure 1:
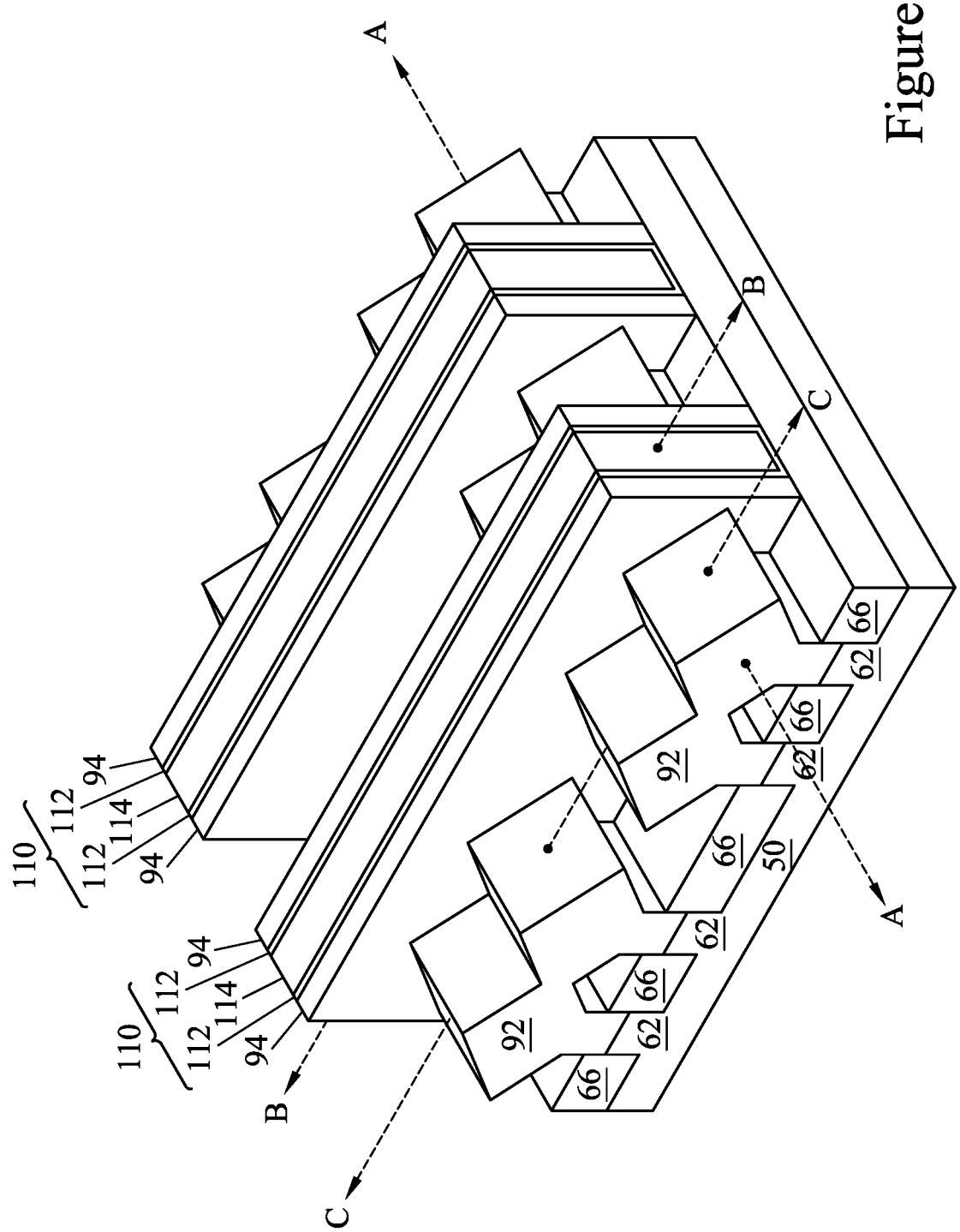
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, an annealing process is performed to repair defects in a replacement gate stack. One or more sacrificial layers are formed to protect the gate dielectric layer of the gate stack during annealing. The sacrificial layers include a layer of silicon formed with a slow deposition process, which allows the sacrificial layer to be formed with a high degree of conformality. Forming the sacrificial layer with a high degree of conformality allows the sacrificial layer to be removed while avoiding damage to underlying fins, particularly when the underlying fins are close together.

FIG. 1 illustrates an example of simplified Fin Field-Effect Transistors (FinFETs) in a three-dimensional view, in accordance with some embodiments. Some other features of the FinFETs (discussed below) are omitted for illustration clarity. The illustrated FinFETs may be electrically coupled in a manner to operate as, for example, one transistor or multiple transistors, such as four transistors.

The FinFETs include fins 62 extending from a substrate 50. Shallow trench isolation (STI) regions 66 are disposed over the substrate 50, and the fins 62 protrude above and from between neighboring STI regions 66. Although the STI regions 66 are described/illustrated as being separate from the substrate 50, as used herein the term "substrate" may be used to refer to just the semiconductor substrate or a semiconductor substrate inclusive of isolation regions. Additionally, although the fins 62 are illustrated as being a single, continuous material of the substrate 50, the fins 62 and/or the substrate 50 may include a single material or a plurality of materials. In this context, the fins 62 refers to the portions extending above and from between the neighboring STI regions 66.

Gate structures 110 are over channel regions of the fins 62. The gate structures 110 include gate dielectrics 112 and gate electrodes 114. The gate dielectrics 112 are along sidewalls and over top surfaces of the fins 62, and the gate electrodes 114 are over the gate dielectrics 112. Source/drain regions 92 are disposed in opposite sides of the fins 62 with respect to the gate dielectrics 112 and gate electrodes 114. Gate spacers 94 separate the source/drain regions 92 from the gate structures 110. In embodiments where multiple transistors are formed, the source/drain regions 92 may be shared between various transistors. In embodiments where one transistor is formed from multiple fins 62, neighboring source/drain regions 92 may be electrically coupled, such as through coalescing the source/drain regions 92 by epitaxial growth, or through coupling the source/drain regions 92 with a same source/drain contact. One or more inter-layer dielectric (ILD) layer(s) (discussed further below) are over the source/drain regions 92 and/or gate electrodes 114, through which contacts (discussed further below) to the source/drain regions 92 and the gate electrodes 114 are formed.

FIG. 1 further illustrates several reference cross-sections. Cross-section A-A is along a longitudinal axis of a fin 62 and in a direction of, for example, a current flow between the source/drain regions 92 of a FinFET. Cross-section B-B is perpendicular to cross-section A-A and is along a longitudinal axis of a gate electrode 114. Cross-section C-C is perpendicular to cross-section A-A and extends through source/drain regions 92 of the FinFETs. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 9 are cross-sectional views of intermediate stages in the manufacturing of FinFETs, in accordance with some embodiments. FIGS. 2 through 9 illustrate reference cross-section A-A illustrated in FIG. 1, except for multiple fins/FinFETs.

Figure 2:
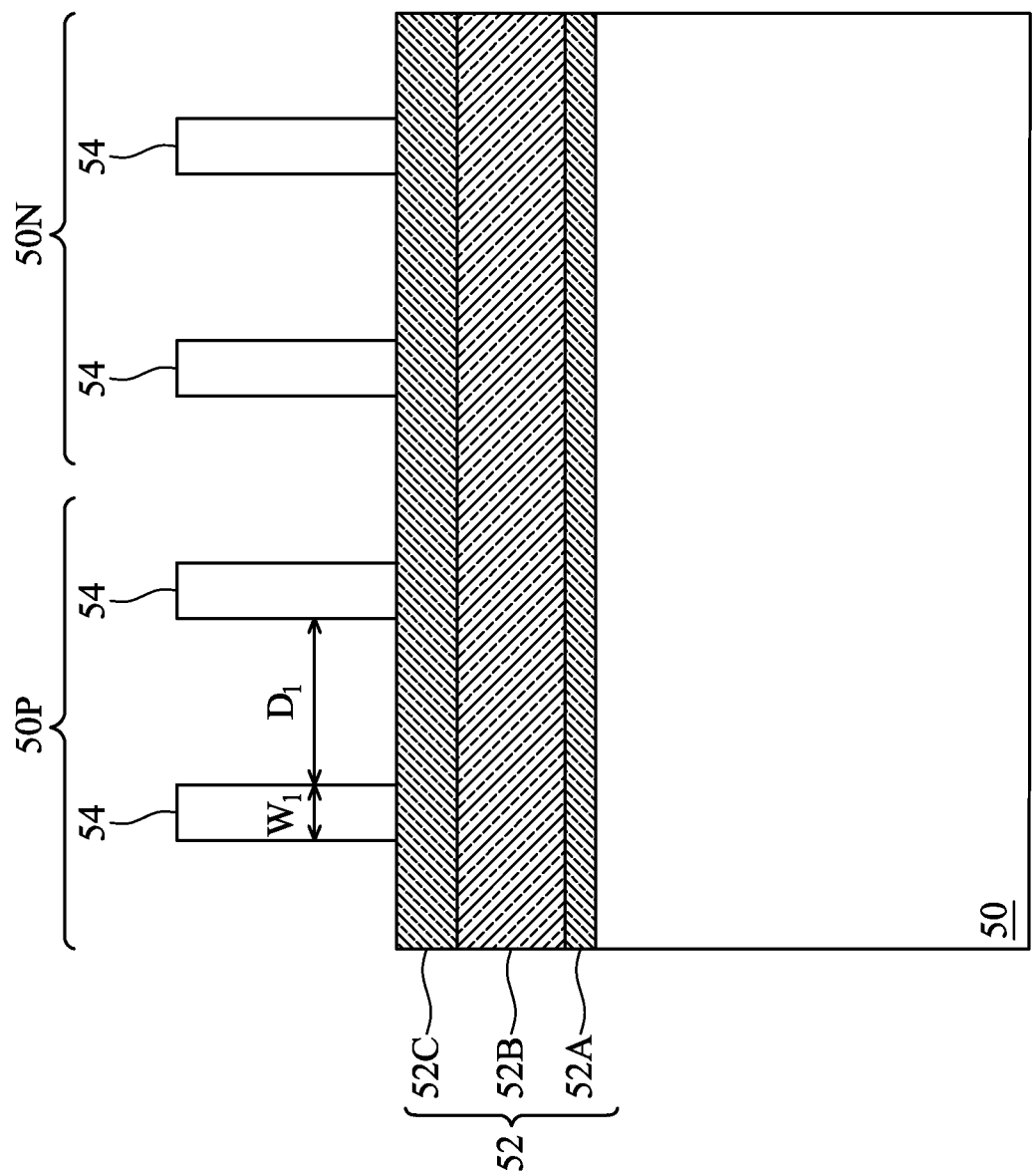
FIGS. 2 through 9 are cross-sectional views of intermediate stages in the manufacturing of FinFETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type FinFETs. The p-type region 50P can be for forming p-type devices, such as PMOS transistors, e.g., p-type FinFETs. The n-type region 50N may be physically separated from the p-type region 50P, and any number of device features (e.g., other active devices, doped regions, isolation structures, etc.) may be disposed between the n-type region 50N and the p-type region 50P.

One or more dielectric layers 52 are formed on the substrate 50. The dielectric layers 52 will be used to pattern the substrate 50. In the illustrated embodiment, the dielectric layers 52 include a first dielectric layer 52A over the substrate 50, a second dielectric layer 52B over the first dielectric layer 52A, and a third dielectric layer 52C over the second dielectric layer 52B. The first dielectric layer 52A may be referred to as a pad layer, may be formed of an oxide such as silicon oxide, and may be formed by performing a thermal oxidation on a surface layer of the substrate 50. The second dielectric layer 52B may be a mask layer, such as a hard mask layer, may be formed of a nitride such as silicon nitride, and may be formed by deposition such as by plasma-enhanced chemical vapor deposition (PECVD), atomic layer deposition (ALD), or the like. The third dielectric layer 52C may be formed of silicon oxide (such as a tetraethylorthosilicate (TEOS) oxide), a nitrogen-free anti-reflective Coating (NFARC), silicon carbide, silicon oxynitride, or the like.

Mandrels 54 are formed over the dielectric layers 52, e.g., on the third dielectric layer 52C. The mandrels 54 can be formed by depositing and patterning a mandrel layer. The mandrel layer is formed of a material that has a high etching selectivity from the etching of the underlying layer(s), e.g., the dielectric layers 52. The mandrel layer may be formed of a material such as amorphous silicon, polysilicon, silicon nitride, silicon oxide, the like, or combinations thereof, and may be formed using a process such as a chemical vapor deposition (CVD), PECVD, or the like. The mandrel layer is then patterned using suitable photolithography and etching techniques to form the mandrels 54. The mandrels 54 can be separated by a spacing distance $D_1$ in the range of about 10 nm to about 15 nm. Each of the mandrels 54 can have a width $W_1$ in the range of about 10 nm to about 15 nm. The mandrels 54 will be used to pattern spacers over the substrate 50. The spacing distance $D_1$ and the width $W_1$ of the mandrels 54 determines the spacing distance between the subsequently patterned spacers.

Figure 3:
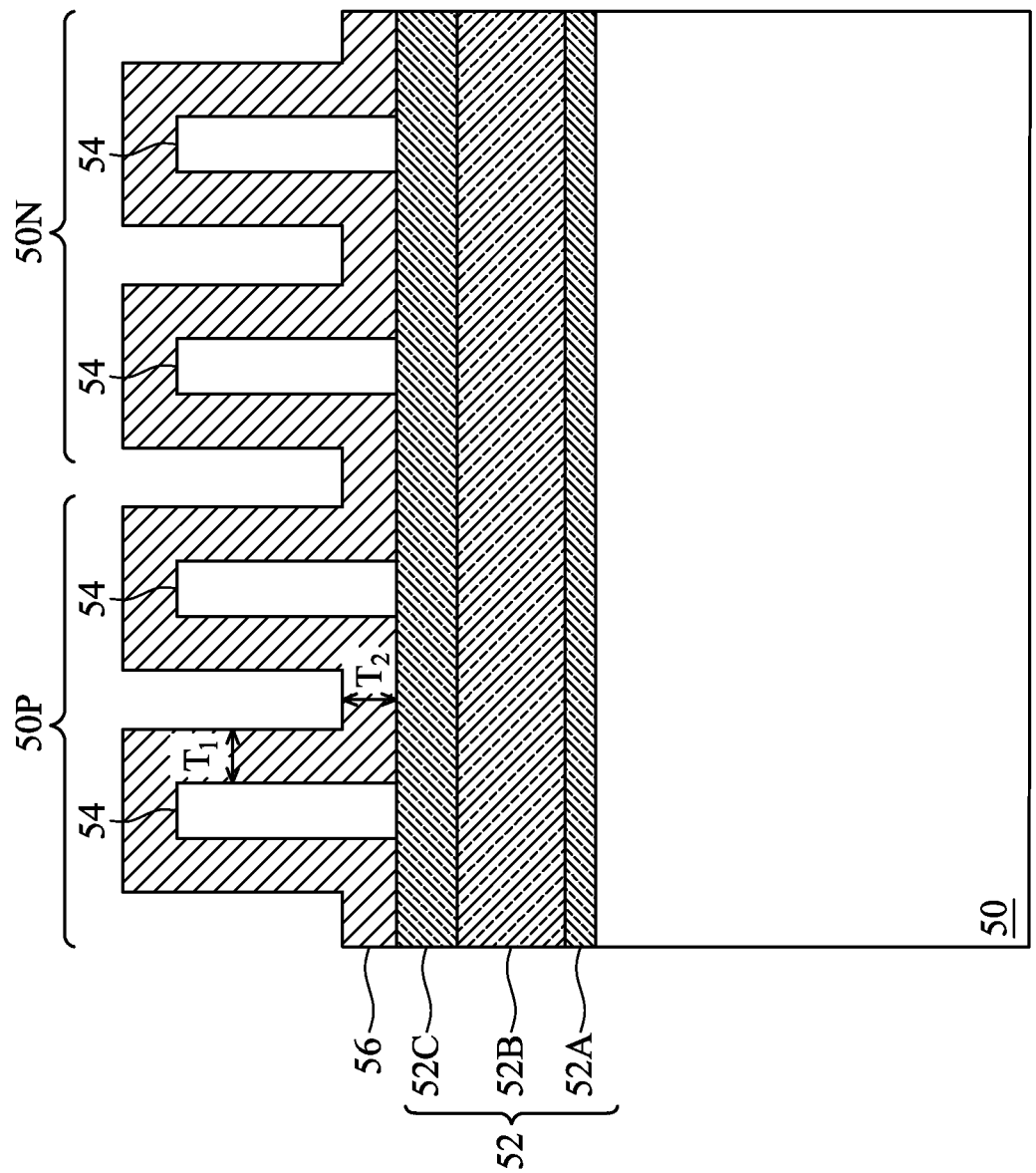

In FIG. 3, a spacer layer 56 is formed over the mandrels 54 and the dielectric layers 52. After formation, the spacer layer 56 extends along the top surfaces of the mandrels 54, the sidewalls of the mandrels 54, and the top surface of the third dielectric layer 52C. The spacer layer 56 is formed of a material that has a high etching selectivity from the etching of the underlying layer(s), e.g., the dielectric layers 52. The spacer layer 56 may be formed from silicon nitride, aluminum oxide, aluminum nitride, tantalum nitride, titanium nitride, titanium oxide, the like, or combinations thereof, and may be formed using a process such as ALD, CVD, or the like. The spacer layer 56 has a high degree of conformality, with the thickness $T_1$ of its vertical portions being equal to or slightly less than the thickness $T_2$ of its horizontal portions. For example, the thickness $T_1$ can be from about 80% to about 100% of the thickness $T_2$. The thickness $T_1$ can be in the range of about 5 nm to about 20 nm and the thickness $T_2$ can be in the range of about 5 nm to about 24 nm. The spacer layer 56 will be patterned to form spacers over the substrate 50. The thickness $T_1$ of the vertical portions of the spacer layer 56 determines the width of the subsequently patterned spacers.

Figure 4:
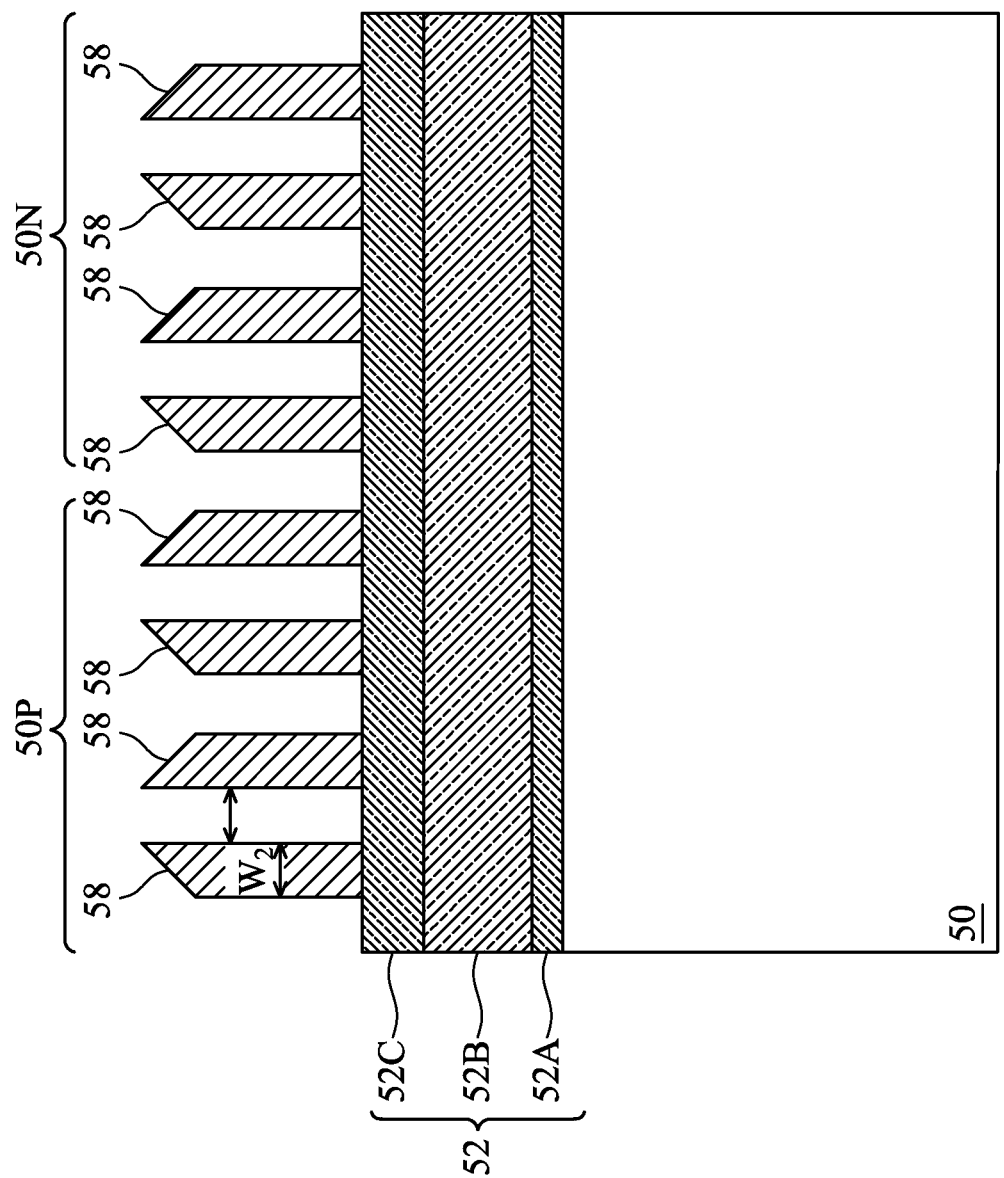

In FIG. 4, the spacer layer 56 is patterned to form spacers 58. A suitable etching process is performed to remove the horizontal portions of the spacer layer 56. The etching process selectively etches the horizontal portions of the spacer layer 56 at a greater rate than the mandrels 54 and the vertical portions of the spacer layer 56. For example, when the spacer layer 56 is formed of silicon nitride, the etching process can be an anisotropic dry etch performed with methane ($CH_4$), chlorine ($Cl_2$), nitrogen ($N_2$), or the like. After the etching process, the spacers 58 comprise the remaining vertical portions of the spacer layer 56. The mandrels 54 can optionally be removed with the horizontal portions of the spacer layer 56, or can be removed in subsequent processing. In some embodiments, the mandrels 54 are removed after the spacers 58 are formed, and can be removed by a suitable etching processes that selectively etches the mandrels 54 at a greater rate than the spacers 58.

As shown in FIG. 4, the spacers 58 have a width $W_2$ and are separated by a spacing distance $D_2$. As noted above, the spacing distance $D_1$ and the width $W_1$ (see FIG. 2) of the mandrels 54 determines the spacing distance $D_2$ between the spacers 58, and the thickness $T_1$ (see FIG. 3) of the vertical portions of the spacer layer 56 determines the width $W_2$ of the spacers 58. Because selective etching process are used to form the spacers 58, the thickness $T_1$ of the vertical portions of the spacer layer 56 decreases by a small amount when forming the spacers 58. For example, the spacing distance $D_2$ between the spacers 58 can be up to about 300% large than the width $W_1$ of the mandrels 54, and the width $W_2$ of the spacers 58 can be up to about 30% smaller than the thickness $T_1$ of the spacer layer 56. The spacing distance $D_2$ between the spacers 58 can be in the range of about 10 nm to about 30 nm, and the width $W_2$ of the spacers 58 can be in the range of about 3.5 nm to about 20 nm. The spacers 58 will be used to pattern fins in the substrate 50. The spacing distance $D_2$ and the width $W_2$ of the spacers 58 determines the spacing distance and the width of the subsequently patterned fins.

Figure 5:
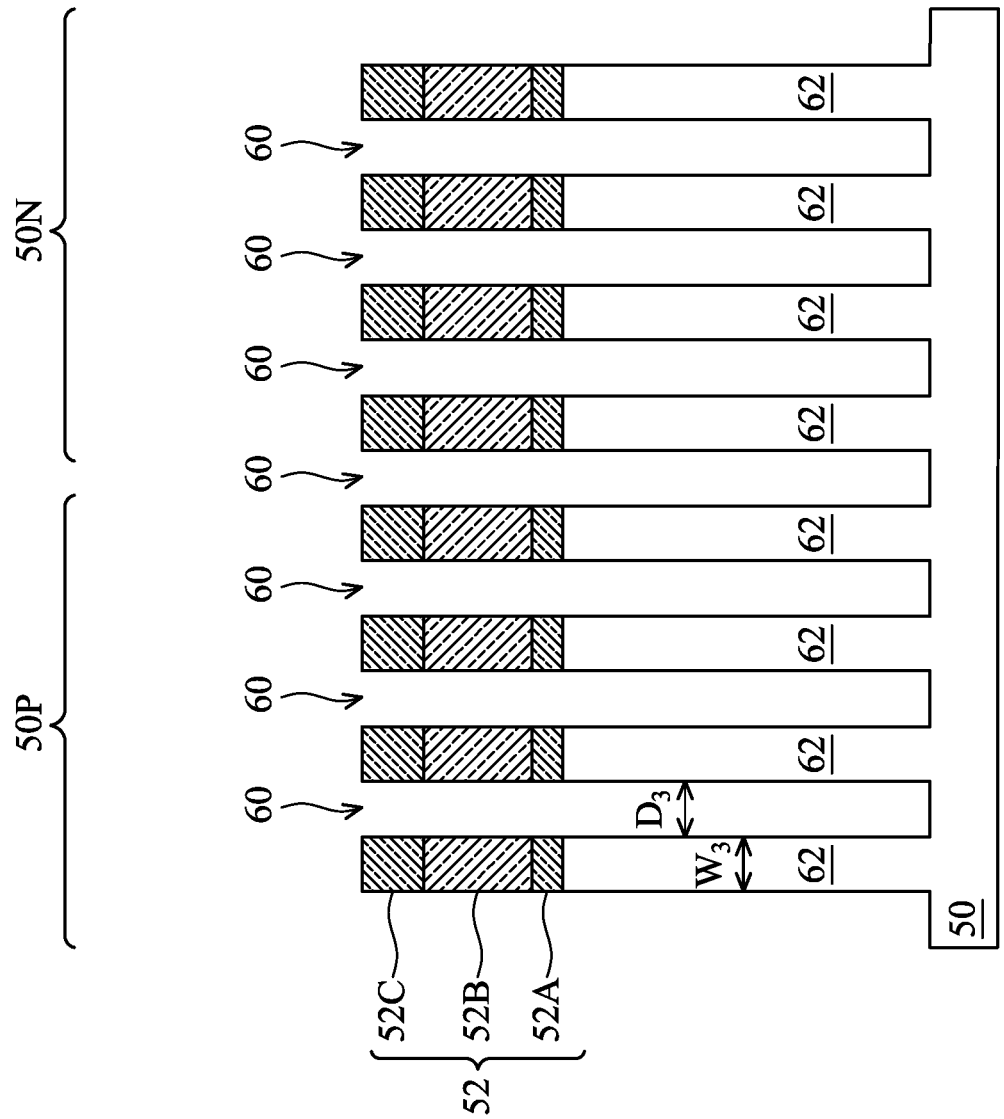

In FIG. 5, fins 62 are formed in the substrate 50. The fins 62 are semiconductor strips. The fins 62 can be formed in the substrate 50 by patterning trenches 60 in the dielectric layers 52 using the spacers 58 as an etching mask, and then transferring the pattern of the trenches 60 from the dielectric layers 52 to the substrate 50. The trenches 60 may be formed by any acceptable etch process, such as a reactive ion etch (RIE), neutral beam etch (NBE), the like, or a combination thereof. The etch may be anisotropic. The spacers 58 may be consumed by the etching process, or may be removed after the etching process. In some embodiments, a cleaning process, such as a wet etch, may be performed to remove any residual material of the spacers 58. The dielectric layers 52 can optionally be removed with the spacers 58, or can be removed in subsequent processing.

As shown in FIG. 5, the fins 62 have a width $W_3$ and are separated by a spacing distance $D_3$. As noted above, the width $W_2$ (see FIG. 4) of the spacers 58 determines the width $W_3$ of the fins 62, and the spacing distance $D_2$ (see FIG. 4) between the spacers 58 determines the spacing distance $D_3$ between the fins 62. Although an anisotropic etching process is used to form the fins 62, such a process may not be perfectly anisotropic. As such, the spacing distance $D_3$ between the fins 62 can be up to about 20% smaller than the spacing distance $D_2$ between the spacers 58, and the width $W_3$ of the fins 62 can be up to about 150% larger than the width $W_2$ of the spacers 58. The spacing distance $D_3$ between the fins 62 and the width $W_3$ of the fins 62 are both small, which allows the integration density of the resulting semiconductor devices to be improved. However, as the spacing distance $D_3$ between the fins 62 decreases, the uniformity of the spacing distance $D_3$ between the fins 62 degrades. When the uniformity of the spacing distance $D_3$ between the fins 62 is poor, a subsequently performed etching process (discussed further below) may need to be performed with a large amount of over-etching, which increases the risk of damage to the fins 62 and can decrease manufacturing yield. Thus, in accordance with some embodiments, the spacing distance $D_3$ between the fins 62 and the width $W_3$ of the fins 62 are selected to strike a balance between integration density and manufacturing yield. In some embodiments, the width $W_1$ of the mandrels 54 (see FIG. 2) is constrained to be in the range of about 10 nm to about 15 nm, which allows the spacing distance $D_3$ between the fins 62 to be in the range of about 8 nm to about 30 nm, and the width $W_3$ of the fins 62 to be in the range of about 3.5 nm to about 30 nm. Such a spacing distance $D_3$ between the fins 62 allows the spacing distance $D_3$ to have a relative standard deviation in the range of about 0.6% to about 0.95%. Forming the fins 62 with a width $W_3$ and a spacing distance $D_3$ in these ranges allows a subsequently performed etching process (discussed further below) to be performed with less over-etching, which decreases the risk of damage to the fins 62 and can increase manufacturing yield. Forming the fins 62 with a width $W_3$ and a spacing distance $D_3$ outside of these ranges may not allow a subsequently performed etching process (discussed further below) to be performed with less over-etching, which may increase the risk of damage to the fins 62 and may decrease manufacturing yield.

Figure 6:
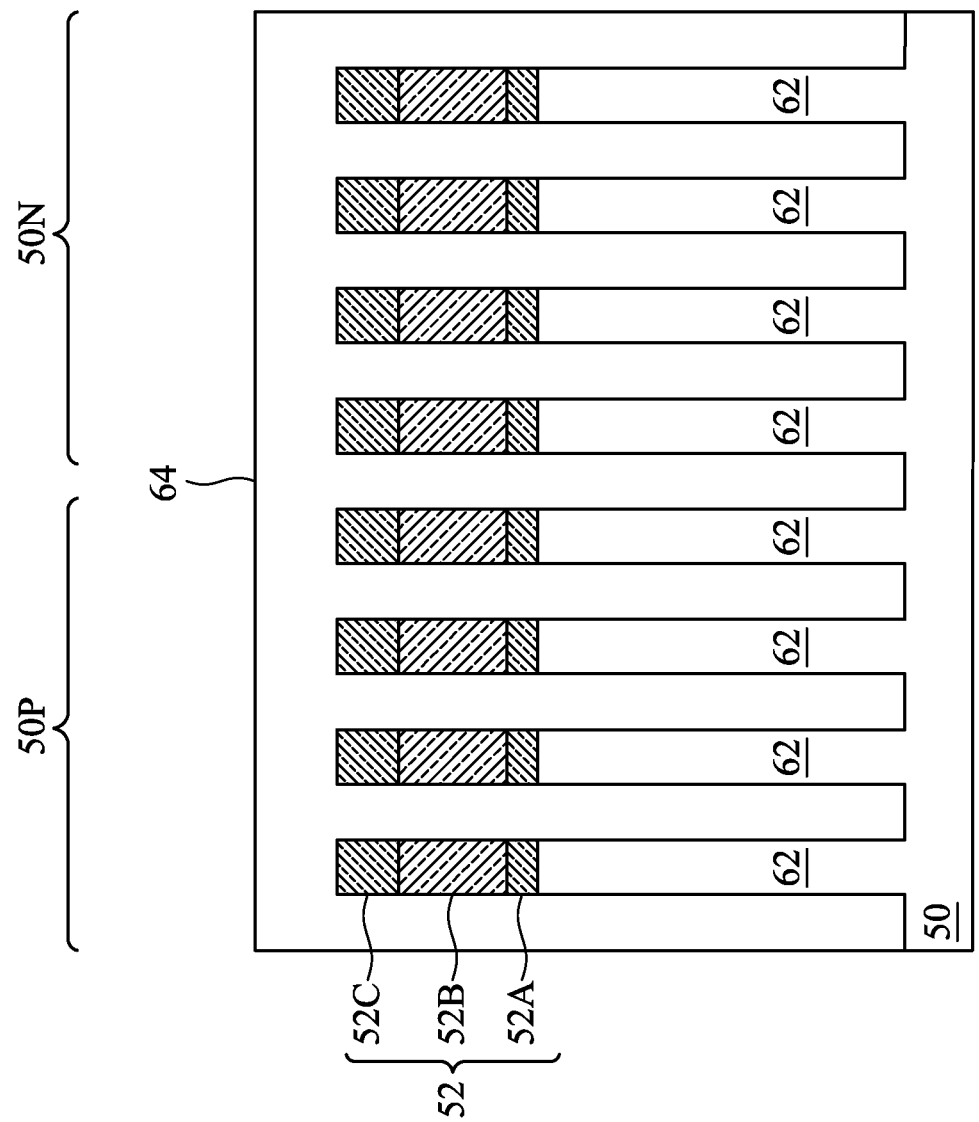

In FIG. 6, an insulation material 64 is formed over the substrate 50 and in the trenches 60 (See FIG. 5) between neighboring fins 62. The insulation material 64 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 64 is silicon oxide formed by a FCVD process. An anneal process may be performed once the insulation material is formed. In an embodiment, the insulation material 64 is formed such that excess insulation material 64 covers the fins 62 and the dielectric layers 52 (if present). Although the insulation material 64 is illustrated as a single layer, some embodiments may utilize multiple layers. For example, in some embodiments a liner may first be formed along a surface of the substrate 50 and sidewalls of the fins 62. Thereafter, a fill material, such as those discussed above may be formed over the liner.

Figure 7:
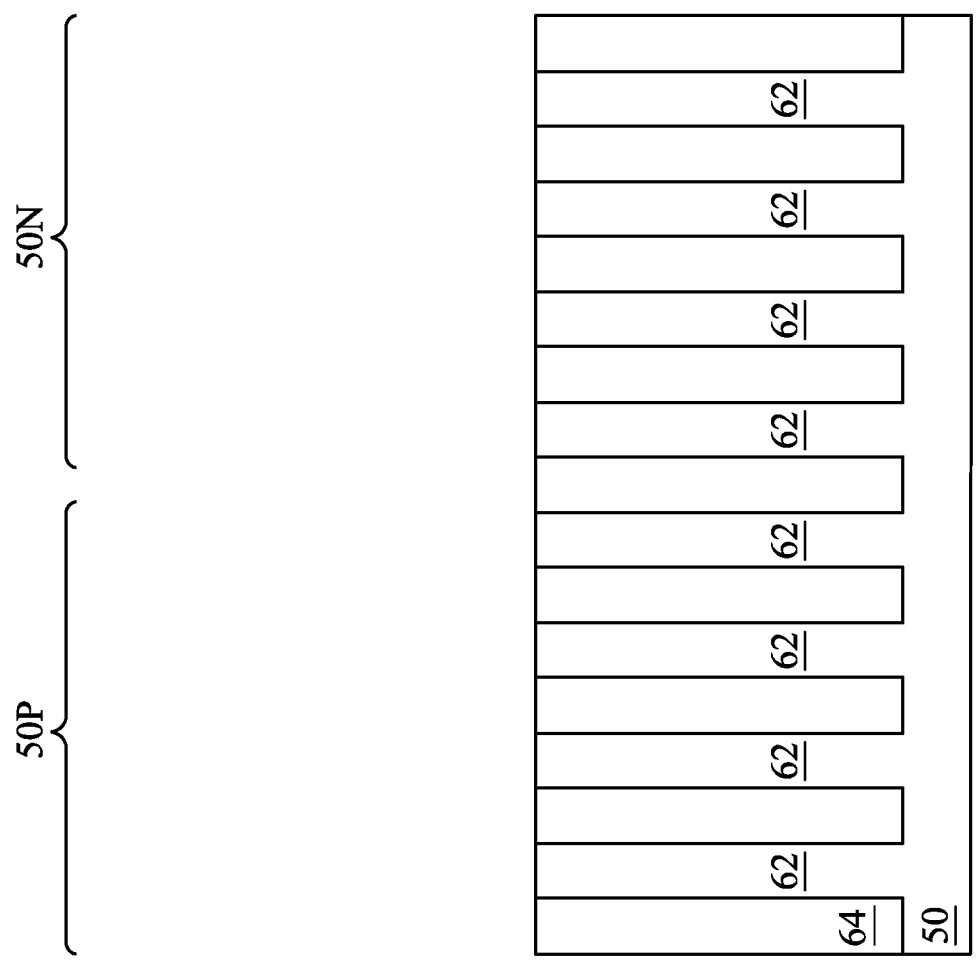

In FIG. 7, a removal process is applied to the insulation material 64 to remove excess insulation material 64 over the fins 62. In some embodiments, a planarization process such as a chemical mechanical polish (CMP), an etch-back process, combinations thereof, or the like may be utilized. The planarization process exposes the fins 62 such that top surfaces of the fins 62 and the insulation material 64 are coplanar after the planarization process is complete. In embodiments in which the dielectric layers 52 (see FIG. 6) remain on the fins 62, the planarization process may remove the dielectric layers 52 such that top surfaces of the fins 62 and the insulation material 64 are coplanar after the planarization process is complete. In another embodiment, the planarization process may expose the dielectric layers 52 such that top surfaces of the third dielectric layer 52C and the insulation material 64 are coplanar after the planarization process is complete.

Figure 8:
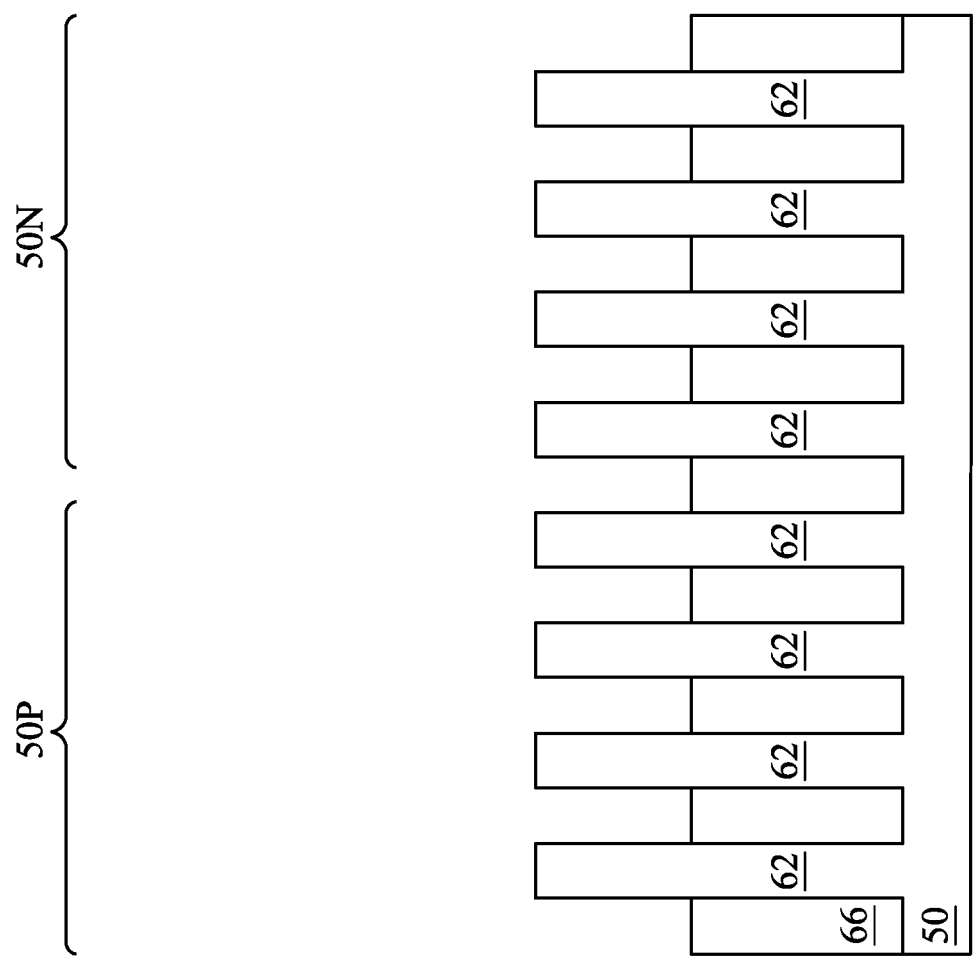

In FIG. 8, the insulation material 64 is recessed to form STI regions 66. The insulation material 64 is recessed such that upper portions of fins 62 in the n-type region 50N and in the p-type region 50P protrude above and from between neighboring STI regions 66. The exposed portions of the fins 62 include what will be channel regions of the resulting FinFETs. Further, the top surfaces of the STI regions 66 may have a flat surface as illustrated, a convex surface, a concave surface (such as dishing), or a combination thereof. The top surfaces of the STI regions 66 may be formed flat, convex, and/or concave by an appropriate etch. The STI regions 66 may be recessed using an acceptable etching process, such as one that is selective to the material of the insulation material 64 (e.g., selectively etches the material of the insulation material 64 at a greater rate than the material of the fins 62). For example, an oxide removal using, for example, dilute hydrofluoric (dHF) acid may be used.

The process described with respect to FIGS. 2 through 8 is just one example of how the fins 62 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 62. For example, the fins 62 in FIG. 7 can be recessed, and a material different from the fins 62 may be epitaxially grown over the recessed fins 62. In such embodiments, the fins 62 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 62. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in n-type region 50N (e.g., an NMOS region) different from the material in p-type region 50P (e.g., a PMOS region). In various embodiments, upper portions of the fins 62 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further, appropriate wells may be formed in the fins 62 and/or the substrate 50. In some embodiments, a p-type well may be formed in the n-type region 50N, and a n-type well may be formed in the p-type region 50P. In some embodiments, a p-type well or a n-type well are formed in both the n-type region 50N and the p-type region 50P.

In the embodiments with different well types, the different implant steps for the n-type region 50N and the p-type region 50P may be achieved using a photoresist and/or other masks. For example, a photoresist may be formed over the fins 62 and the STI regions 66 in the n-type region 50N. The photoresist is patterned to expose the p-type region 50P of the substrate 50. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration of up to about $10^{18}$ $cm^{-3}$, such as in the range of about $10^{16}$ $cm^{-3}$ to about $10^{18}$ $cm^{-3}$. After the implant, the photoresist is removed, such as by an acceptable ashing process.

Following the implanting of the p-type region 50P, a photoresist is formed over the fins 62 and the STI regions 66 in the p-type region 50P. The photoresist is patterned to expose the n-type region 50N of the substrate 50. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration of up to about $10^{18}$ $cm^{-3}$, such as in the range of about $10^{16}$ $cm^{-3}$ to about $10^{18}$ $cm^{-3}$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 9:
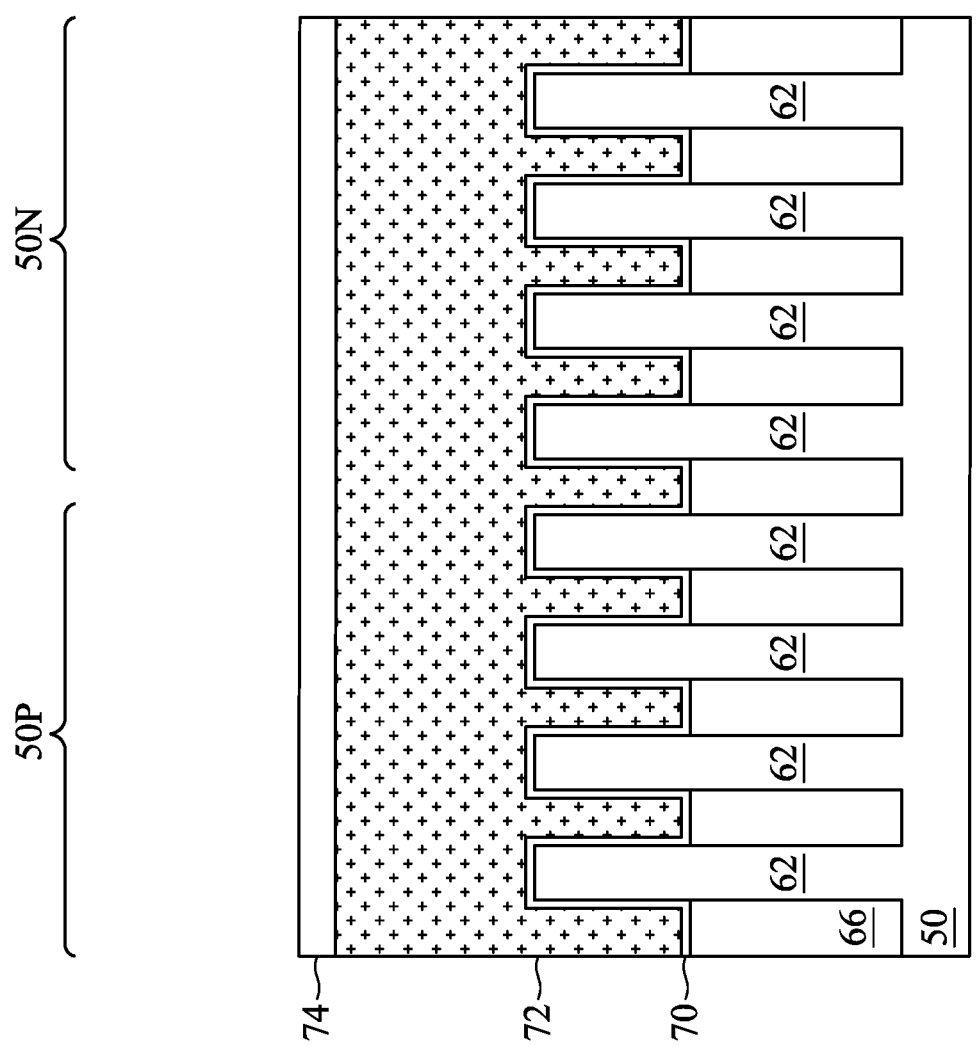

In FIG. 9, a dummy dielectric layer 70 is formed on the fins 62. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions, e.g., the STI regions 66 and/or the dummy dielectric layer 70. The mask layer 74 may include one or more layers of, for example, silicon nitride, silicon oxynitride, or the like. In this example, a single dummy gate layer 72 and a single mask layer 74 are formed across the n-type region 50N and the p-type region 50P. In the illustrated example, the dummy dielectric layer 70 covers the fins 62 and the STI regions 66, and extends over the STI regions 66 and between the dummy gate layer 72 and the STI regions 66. In another embodiment, the dummy dielectric layer 70 covers only the fins 62.

FIGS. 10A through 22B are cross-sectional views of intermediate stages in the manufacturing of FinFETs, in accordance with some embodiments. FIGS. 10A, 11A, 12A, 13A, 14A, 15A, 16A, 17A, 18A, 19A, 20A, 21A, and 22A are illustrated along reference cross-section A-A illustrated in FIG. 1, except two fins 62 are shown. FIGS. 10B, 11B, 12B, 13B, 14B, 15B, 16B, 17B, 18B, 19B, 20B, 21B, and 22B are illustrated along reference cross-section B-B illustrated in FIG. 1. FIGS. 12C and 12D are illustrated along reference cross-section C-C illustrated in FIG. 1, except two fins 62 are shown. FIGS. 10A through 22B illustrate features in either of the n-type region 50N and the p-type region 50P. For example, the structures illustrated in FIGS. 10A through 22B may be applicable to both the n-type region 50N and the p-type region 50P. Differences (if any) in the structures of the n-type region 50N and the p-type region 50P are described in the text accompanying each figure.

Figure 10B:
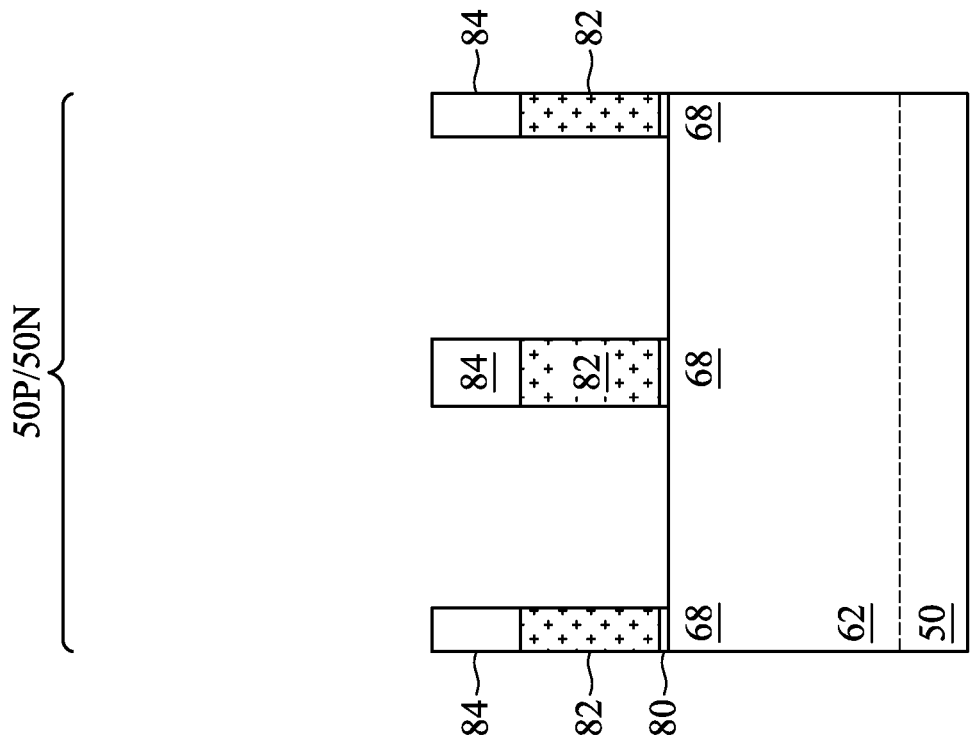
Figure 10A:
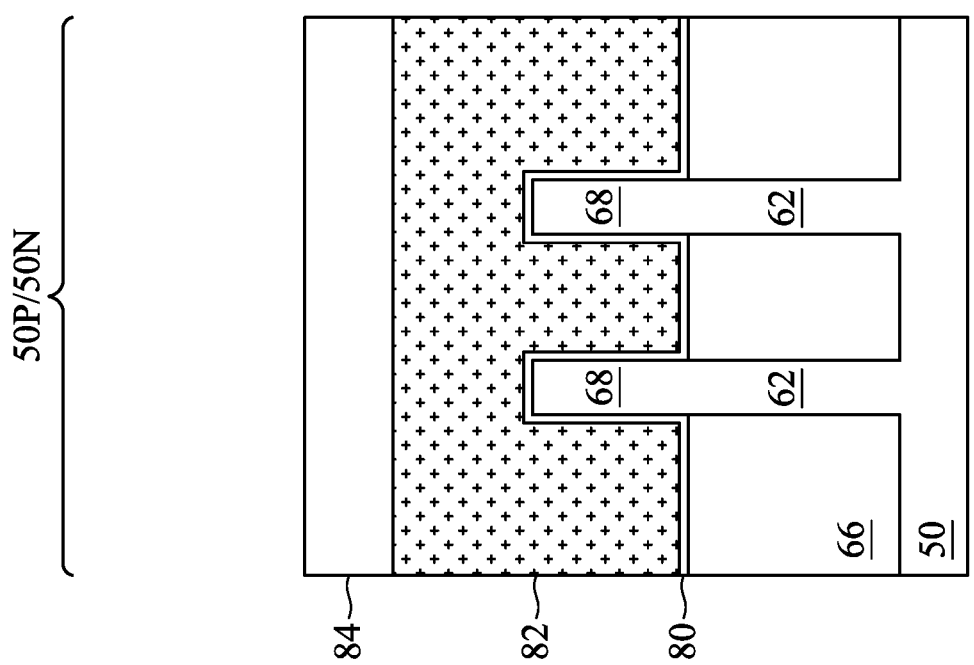

In FIGS. 10A and 10B, the mask layer 74 (see FIG. 9) is patterned using acceptable photolithography and etching techniques to form masks 84. The pattern of the masks 84 then may be transferred to the dummy gate layer 72 to form dummy gates 82. In some embodiments, the pattern of the masks 84 may also be transferred to the dummy dielectric layer 70 by an acceptable etching technique to form dummy dielectrics 80. The dummy gates 82 cover respective channel regions 68 of the fins 62. The pattern of the masks 84 may be used to physically separate each of the dummy gates 82 from adjacent dummy gates. The dummy gates 82 may also have a lengthwise direction substantially perpendicular to the lengthwise direction of the fins 62.

Figure 11B:
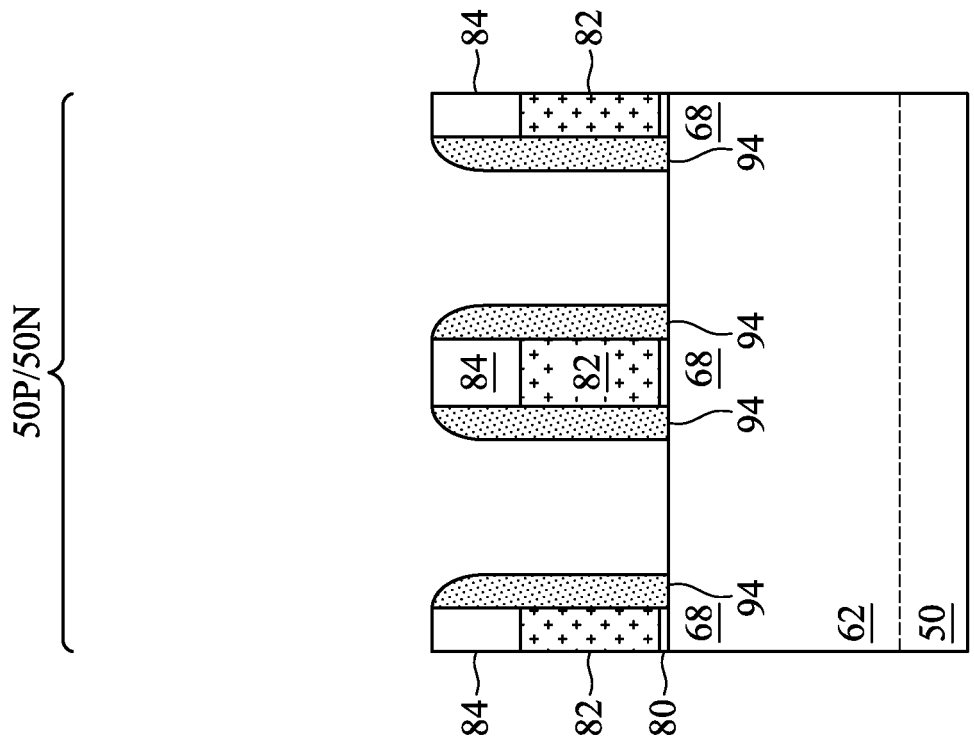
Figure 11A:
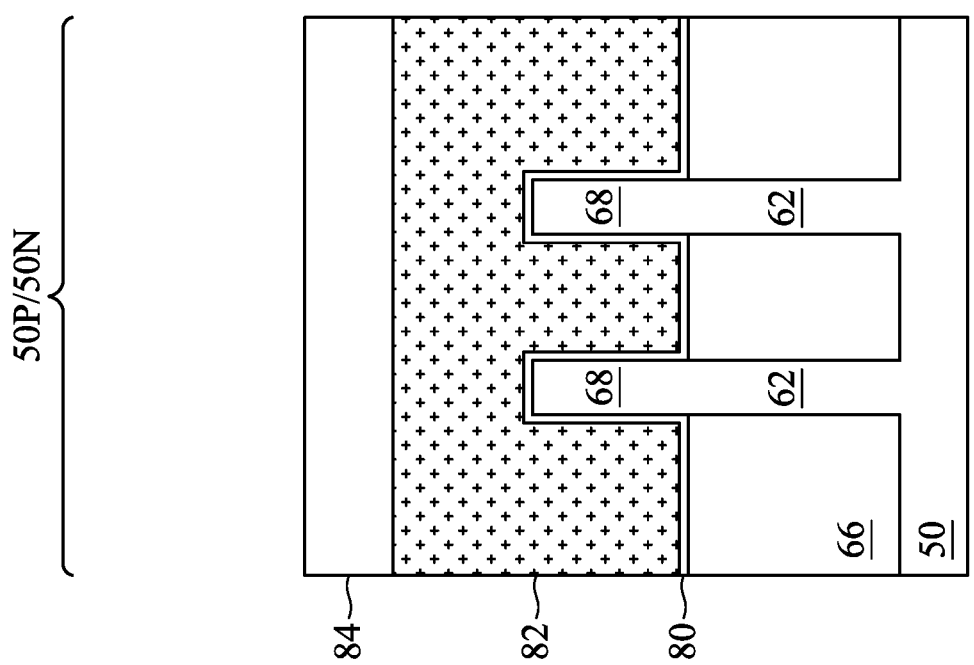

In FIGS. 11A and 11B, gate spacers 94 are formed on exposed surfaces of the dummy gates 82, the masks 84, and/or the fins 62. The gate spacers 94 may be formed by conformally forming an insulating material and subsequently etching the insulating material. The insulating material of the gate spacers 94 may be silicon nitride, silicon carbonitride, silicon oxycarbonitride, a combination thereof, or the like, and may be formed by thermal oxidation, deposition, a combination thereof, or the like. In some embodiments, the gate spacers 94 are formed from a multi-layered insulating material, and include multiple layers. For example, the gate spacers 94 may include multiple layers of silicon carbonitride, may include multiple layers of silicon oxycarbonitride, or may include a layer of silicon oxide disposed between two layers of silicon nitride. The etching of the gate spacers 94 can be anisotropic. After etching, the gate spacers 94 can have straight sidewalls or curved sidewalls.

Before or during the formation of the gate spacers 94, implants for lightly doped source/drain (LDD) regions may be performed. In the embodiments with different device types, similar to the implants discussed above in FIG. 8, a mask, such as a photoresist, may be formed over the n-type region 50N, while exposing the p-type region 50P, and appropriate type (e.g., p-type) impurities may be implanted into the exposed fins 62 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 62 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in the range of about $10^{15}$ cm$^{-3}$ to about $10^{19}$ cm$^{-3}$. An anneal may be used to repair implant damage and to activate the implanted impurities.

It is noted that the above disclosure generally describes a process of forming spacers and LDD regions. Other processes and sequences may be used. For example, fewer or additional spacers may be utilized, different sequence of steps may be utilized, spacers may be formed and removed, and/or the like. Furthermore, the n-type and p-type devices may be formed using different structures and steps.

Figure 12B:
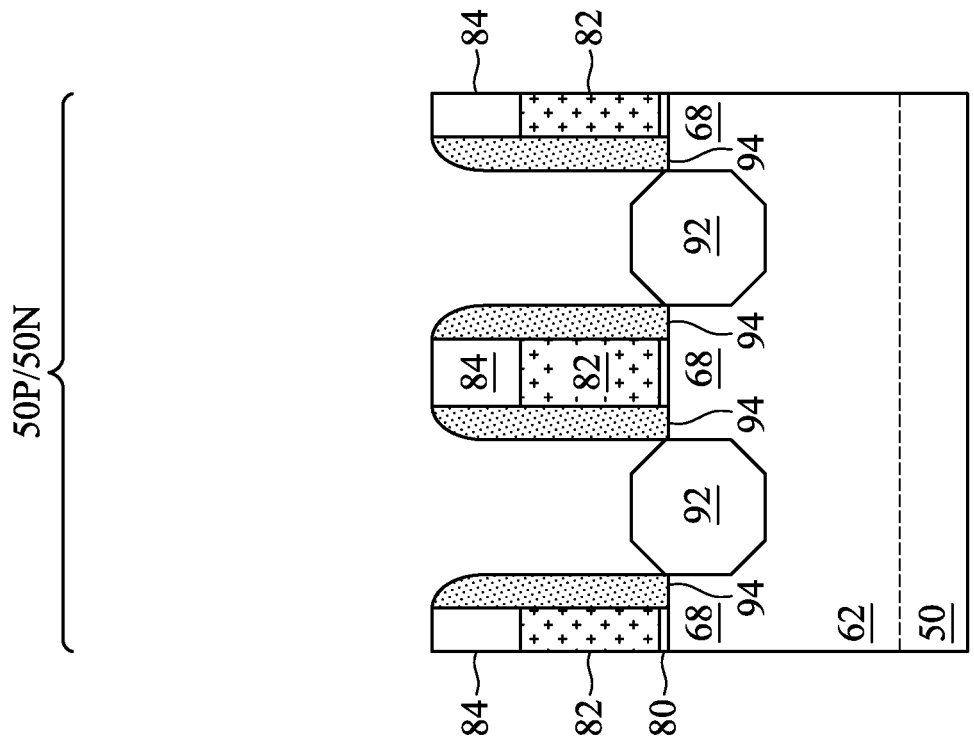
Figure 12A:
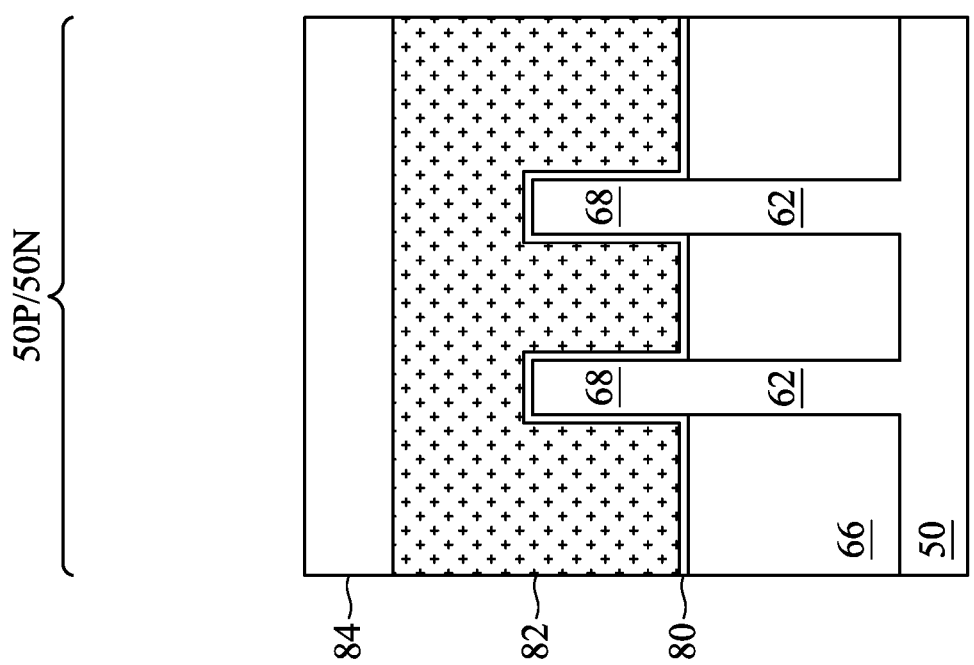
Figure 12C:
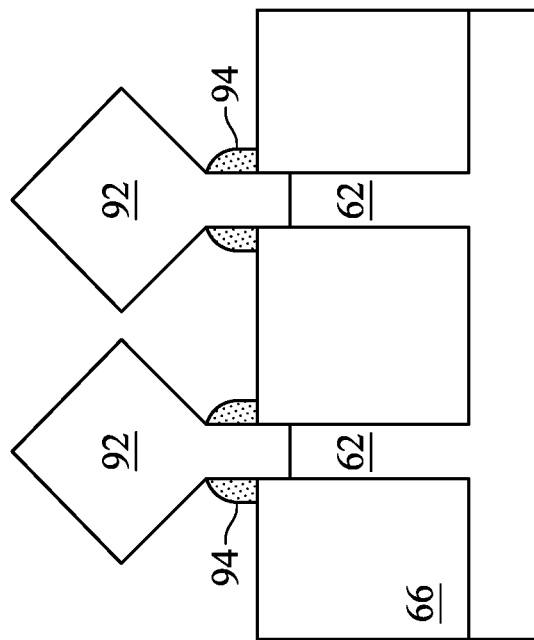
Figure 12D:
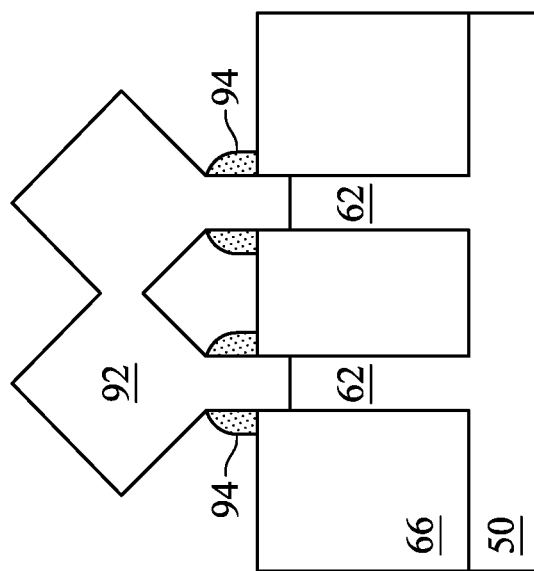

In FIGS. 12A and 12B epitaxial source/drain regions 92 are formed in the fins 62. The epitaxial source/drain regions 92 are formed in the fins 62 such that each of the dummy gates 82 is disposed between respective neighboring pairs of the epitaxial source/drain regions 92. In some embodiments the epitaxial source/drain regions 92 may extend into, and may also penetrate through, the fins 62. In some embodiments, the gate spacers 94 are used to separate the epitaxial source/drain regions 92 from the dummy gates 82 by an appropriate lateral distance so that the epitaxial source/drain regions 92 do not short out subsequently formed gates of the resulting FinFETs. A material of the epitaxial source/drain regions 92 may be selected to exert stress in the channel regions 68, thereby improving performance.

The epitaxial source/drain regions 92 in the n-type region 50N may be formed by masking the p-type region 50P and etching source/drain regions of the fins 62 in the n-type region 50N to form recesses in the fins 62. Then, the epitaxial source/drain regions 92 in the n-type region 50N are epitaxially grown in the recesses. The epitaxial source/drain regions 92 may include any acceptable material, such as appropriate for n-type FinFETs. For example, if the fins 62 are silicon, the epitaxial source/drain regions 92 in the n-type region 50N may include materials exerting a tensile strain in the channel regions 68, such as silicon, silicon carbide, phosphorous doped silicon carbide, silicon phosphide, or the like. The epitaxial source/drain regions 92 in the n-type region 50N may have surfaces raised from respective surfaces of the fins 62 and may have facets.

The epitaxial source/drain regions 92 in the p-type region 50P may be formed by masking the n-type region 50N and etching source/drain regions of the fins 62 in the p-type region 50P to form recesses in the fins 62. Then, the epitaxial source/drain regions 92 in the p-type region 50P are epitaxially grown in the recesses. The epitaxial source/drain regions 92 may include any acceptable material, such as appropriate for p-type FinFETs. For example, if the fins 62 are silicon, the epitaxial source/drain regions 92 in the p-type region 50P may comprise materials exerting a compressive strain in the channel regions 68, such as silicon-germanium, boron doped silicon-germanium, germanium, germanium tin, or the like. The epitaxial source/drain regions 92 in the p-type region 50P may have surfaces raised from respective surfaces of the fins 62 and may have facets.

The epitaxial source/drain regions 92 and/or the fins 62 may be implanted with dopants to form source/drain regions, similar to the process previously discussed for forming lightly-doped source/drain regions, followed by an anneal. The source/drain regions may have an impurity concentration in the range of about $10^{19}$ cm$^{-3}$ to about $10^{21}$ cm$^{-3}$. The n-type and/or p-type impurities for source/drain regions may be any of the impurities previously discussed. In some embodiments, the epitaxial source/drain regions 92 may be in situ doped during growth.

As a result of the epitaxy processes used to form the epitaxial source/drain regions 92 in the n-type region 50N and the p-type region 50P, upper surfaces of the epitaxial source/drain regions have facets which expand laterally outward beyond sidewalls of the fins 62. In some embodiments, these facets cause adjacent epitaxial source/drain regions 92 of a same FinFET to merge as illustrated by FIG. 12C. In other embodiments, adjacent epitaxial source/drain regions 92 remain separated after the epitaxy process is completed as illustrated by FIG. 12D. In the illustrated embodiments, gate spacers 94 are formed covering portions of the sidewalls of the fins 62 that extend above the STI regions 66 thereby blocking the epitaxial growth. In another embodiment, the spacer etch used to form the gate spacers 94 may be adjusted to remove the spacer material to allow the epitaxially grown regions to extend to the surface of the STI regions 66.

Figure 13B:
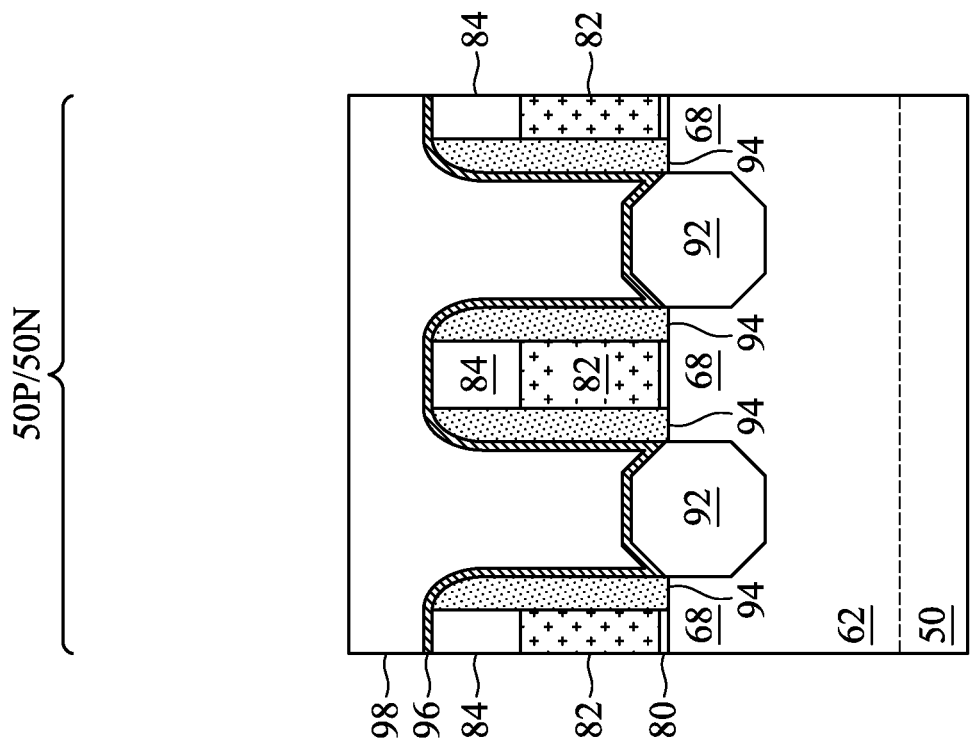
Figure 13A:
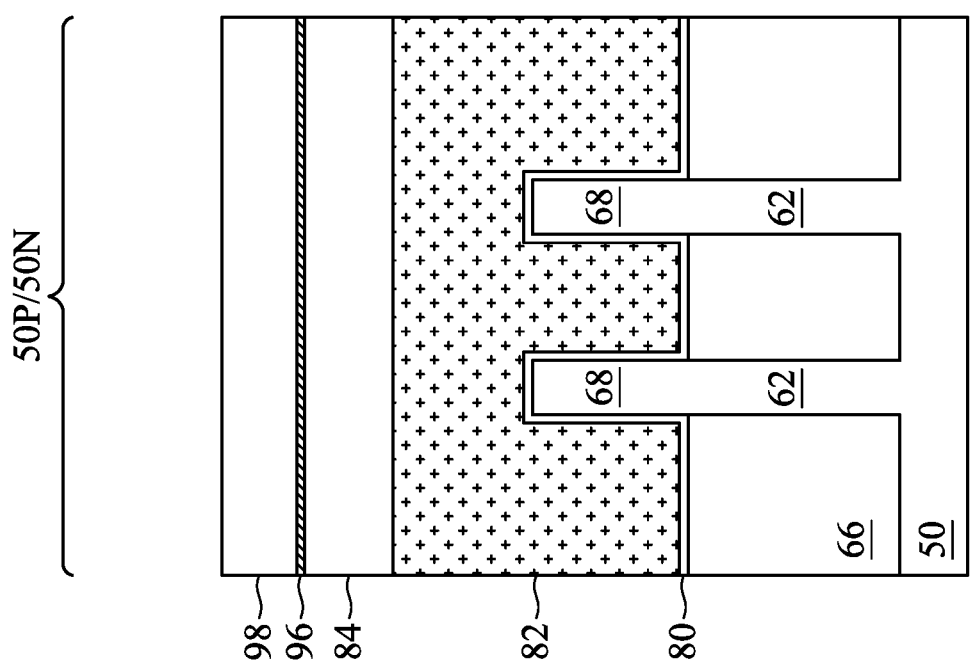

In FIGS. 13A and 13B, a first ILD layer 98 is deposited over the masks 84 (if present) or the dummy gates 82, the epitaxial source/drain regions 92, and the gate spacers 94. The first ILD layer 98 may be formed of a dielectric material, and may be deposited by any suitable method, such as CVD, PECVD, or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 96 is disposed between the first ILD layer 98 and the epitaxial source/drain regions 92, the masks 84 (if present) or the dummy gates 82, and the gate spacers 94. The CESL 96 may be formed of a dielectric material, such as, silicon nitride, silicon oxide, silicon oxynitride, or the like, that has a high etching selectivity from the etching of the first ILD layer 98.

Figure 14B:
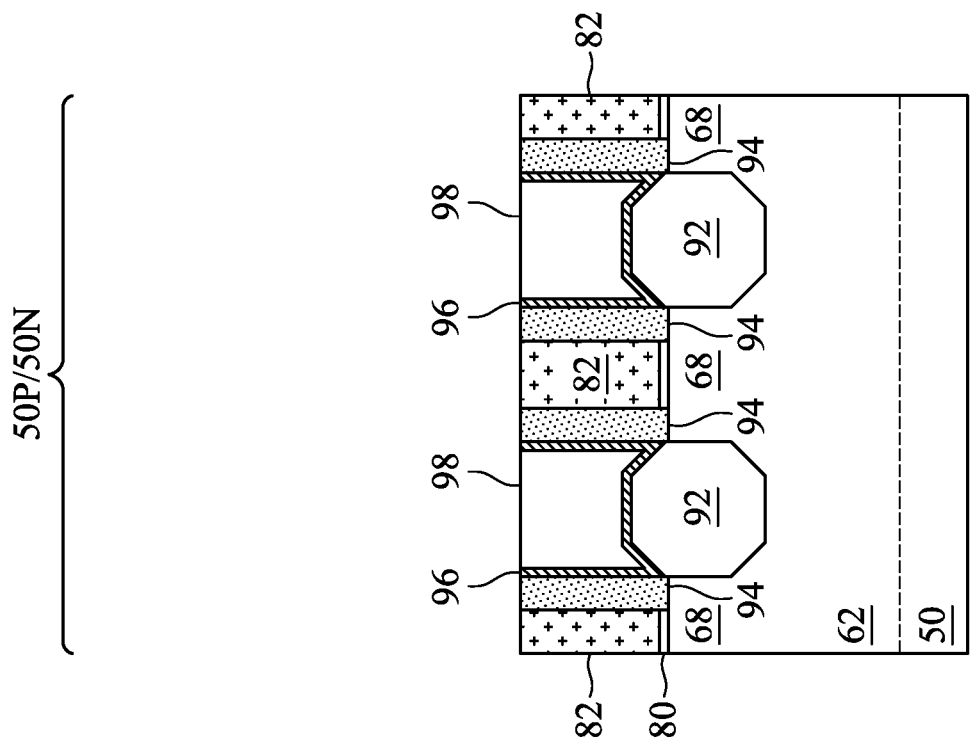
Figure 14A:
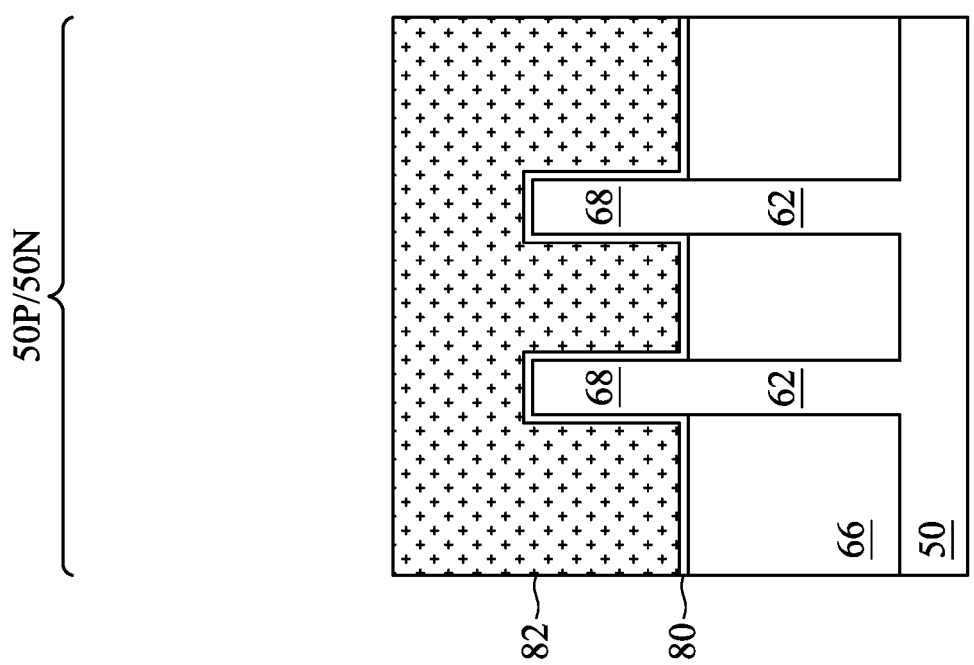

In FIGS. 14A and 14B, a planarization process, such as a CMP, may be performed to level the top surface of first ILD layer 98 with the top surfaces of the masks 84 (if present) or the dummy gates 82. The planarization process may also remove the masks 84 on the dummy gates 82, and portions of the gate spacers 94 along sidewalls of the masks 84. The planarization process can also remove portions of the CESL 96 over the dummy gates 82 and the gate spacers 94. After the planarization process, top surfaces of the dummy gates 82, the gate spacers 94, and the first ILD layer 98 are coplanar. Accordingly, the top surfaces of the dummy gates 82 are exposed through the first ILD layer 98. In some embodiments, the masks 84 may remain, in which case the planarization process levels the top surface of the first ILD layer 98 with the top surfaces of of the masks 84.

Figures 15A, 15B:
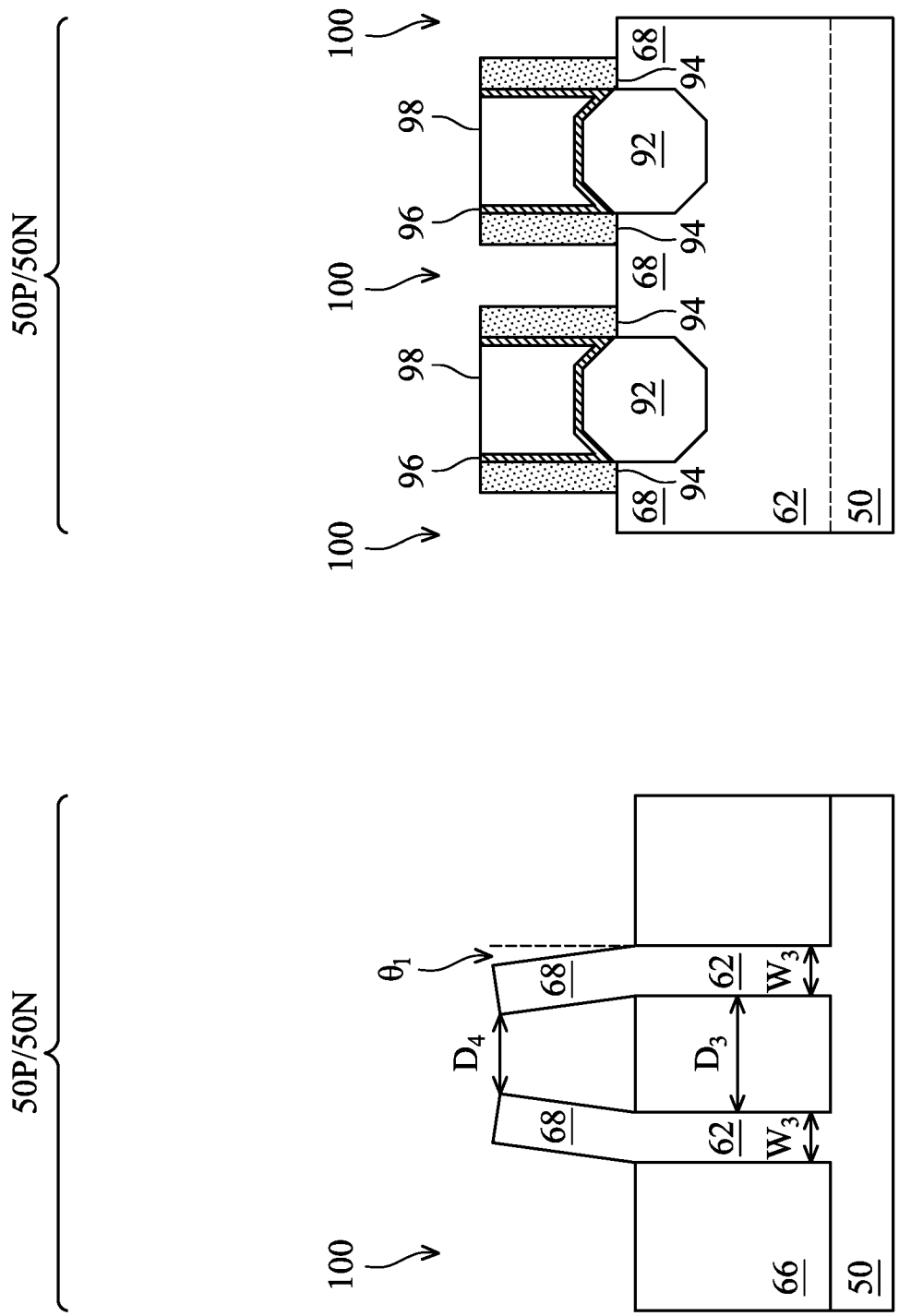

In FIGS. 15A and 15B, the masks 84 (if present) and the dummy gates 82 are removed in one or more etching step(s), so that recesses 100 are formed. Portions of the dummy dielectrics 80 in the recesses 100 may also be removed. In some embodiments, only the dummy gates 82 are removed and the dummy dielectrics 80 remain and are exposed by the recesses 100. In some embodiments, the dummy dielectrics 80 are removed from recesses 100 in a first region of a die (e.g., a core logic region) and remain in recesses 100 in a second region of the die (e.g., an input/output region). In some embodiments, the dummy gates 82 are removed by a wet etch process that selectively etches the dummy gates 82 at a greater rate than the first ILD layer 98, the gate spacers 94, or the dummy dielectrics 80. For example, the dummy gates 82 can be removed by a wet etch performed with ammonium hydroxide (NH$_4$OH) and deionized water. The recesses 100 expose and/or overly the channel regions 68 of one or more fins 62. Each of the channel regions 68 is disposed between neighboring pairs of the epitaxial source/drain regions 92. During the removal, the dummy dielectrics 80 may be used as etch stop layers when the dummy gates 82 are etched. The dummy dielectrics 80 may then be optionally removed after the removal of the dummy gates 82. In some embodiments, the dummy dielectrics 80 are removed by a wet etch process that selectively etches the dummy dielectrics 80 at a greater rate than the first ILD layer 98 or the gate spacers 94. For example, the dummy dielectrics 80 can be removed by a dry etch performed with fluorine.

As noted above, the spacing distance $D_3$ between the fins 62 and the width $W_3$ of the fins 62 are both small, which allows the integration density of the resulting semiconductor devices to be improved. However, when the fins 62 have a small width $W_3$, bending of the fins 62 can occur during formation of the recesses 100, e.g., during removal of the dummy gates 82 or the dummy dielectrics 80. For example, removing the dummy gates 82 can relax stresses in the material of the fins 62, which can allow bending to occur. Likewise, when the dummy gates 82 and the dummy dielectrics 80 are removed by a wet etch, the viscosity of the wet etchants can exert lateral forces that bend the fins 62. In some embodiments, adjacent ones of the fins 62, such as the fins 62 of a same FinFET (e.g., a FinFET with merged epitaxial source/drain regions 92, see FIG. 12C) can bend towards one another. As such, lower portions of the fins 62 (e.g., below the top surfaces of the STI regions 66) can be separated by the original spacing distance $D_3$, but upper portions of the fins 62 (e.g., above the top surfaces of the STI regions 66) can have a spacing distance that continually decreases along a direction extending away from the substrate 50. The spacing distance of the upper portions of the fins 62 can decrease from the original spacing distance $D_3$ to a reduced spacing distance $D_4$. The reduced spacing distance $D_4$ can be up to about 60% less than the original spacing distance $D_3$, such as in the range of about 3.2 nm to about 30 nm. After the fins 62 are bent, the sidewalls of the upper portions of the fins 62 form angles $\theta_1$ with the sidewalls of the lower portions of the fins 62. The angles $\theta_1$ can be up to about 7 degrees.

Figures 16A, 16B:
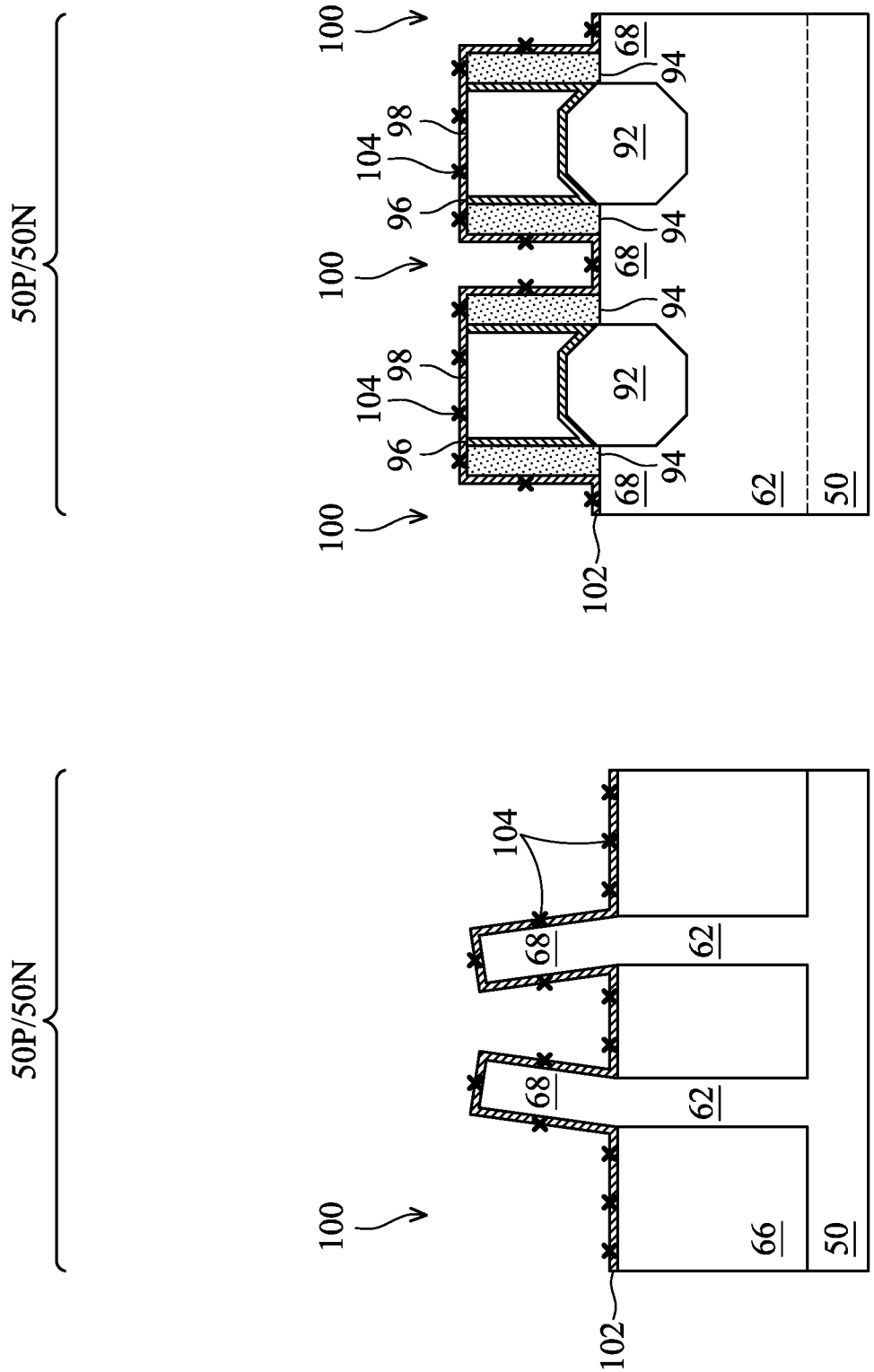

In FIGS. 16A and 16B, a gate dielectric layer 102 is formed. The gate dielectric layer 102 includes one or more layers deposited in the recesses 100, such as on the top surfaces and the sidewalls of the fins 62 and on sidewalls of the gate spacers 94. The gate dielectric layer 102 may also be formed on the top surface of the first ILD layer 98. In some embodiments, the gate dielectric layer 102 comprises one or more dielectric layers, such as one or more layers of silicon oxide, silicon nitride, metal oxide, metal silicate, or the like. For example, in some embodiments, the gate dielectric layer 102 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, and combinations thereof. The gate dielectric layer 102 may include a dielectric layer having a k value greater than about 7.0. The formation methods of the gate dielectric layer 102 may include Molecular-Beam Deposition (MBD), ALD, PECVD, and the like. In embodiments where portions of the dummy dielectrics 80 remains in the recesses 100, the gate dielectric layer 102 include a material of the dummy dielectrics 80 (e.g., silicon oxide).

The gate dielectric layer 102 can include defects 104 (each of which is illustrated with an "X") after deposition. Some of the defects 104 are interfacial defects located at the interface of the gate dielectric layer 102 and the fins 62. Some of the defects 104 are oxygen vacancy defects in the material(s) of the gate dielectric layer 102, such as in the high-k layer when the gate dielectric layer 102 includes a high-k layer of a metal oxide, or in the interfacial layer when the gate dielectric layer 102 includes an interfacial layer of silicon oxide. Oxygen vacancy defects can be caused by, e.g., insufficient oxidation during formation of the material(s) of the gate dielectric layer 102. The defects 104 will be repaired in a subsequent annealing process (discussed further below).

Figure 17B:
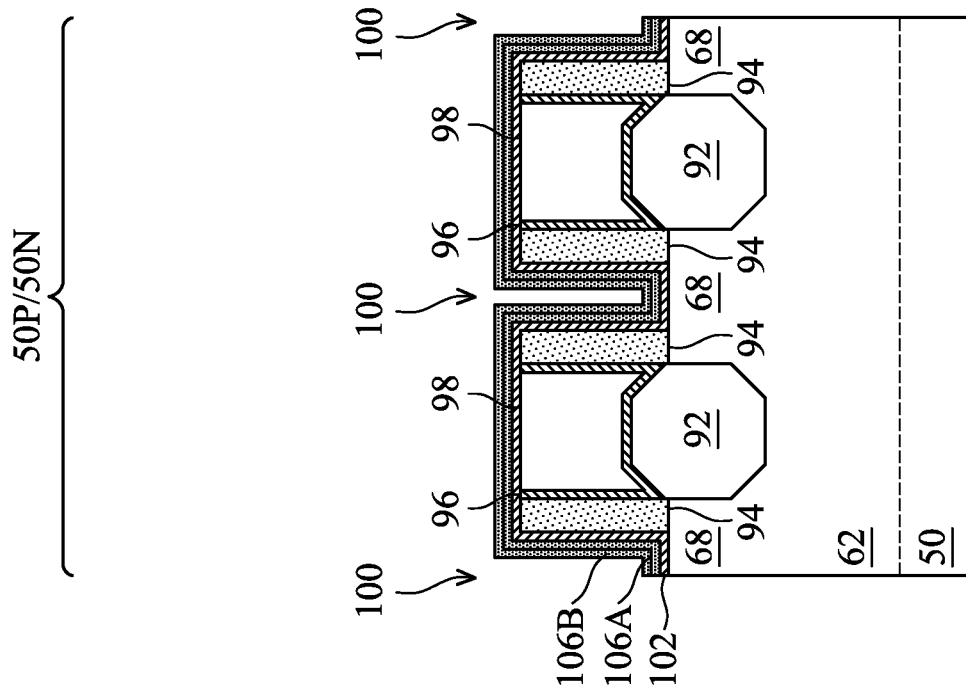
Figure 17A:
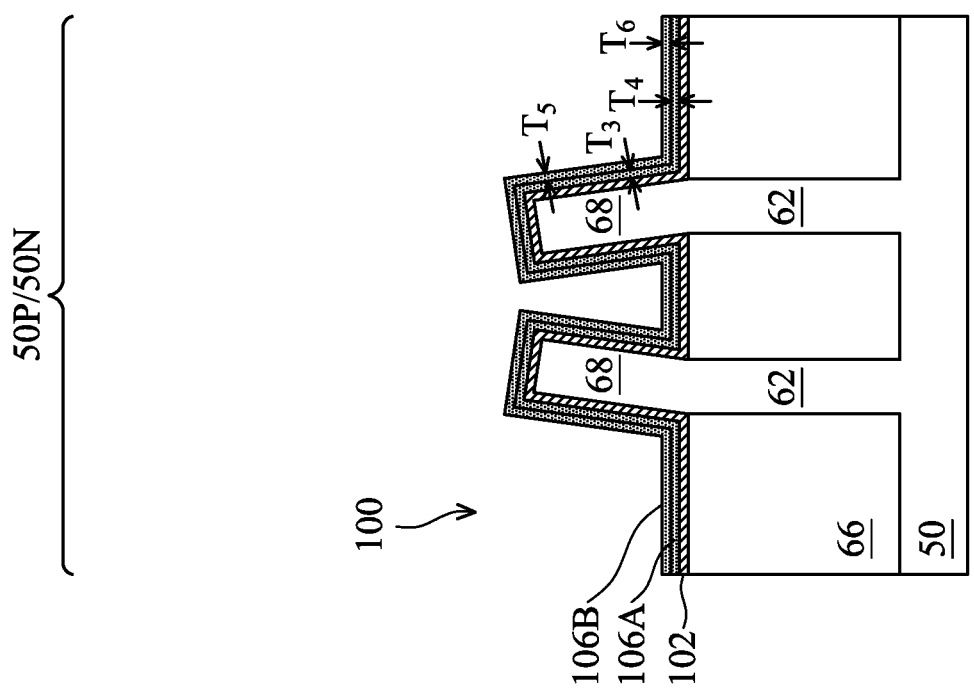

In FIGS. 17A and 17B, one or more sacrificial layers are formed on the gate dielectric layer 102. As discussed further below, the sacrificial layers will be used to protect the gate dielectric layer 102 during an annealing process used to repair the defects 104 (see FIGS. 16A and 16B). In some embodiments, the sacrificial layers include a first sacrificial layer 106A and a second sacrificial layer 106B. The first sacrificial layer 106A is in direct physical contact with the gate dielectric layer 102 and the second sacrificial layer 106B is in direct physical contact with the first sacrificial layer 106A. The first sacrificial layer 106A is formed of a material that has a high etching selectivity from the etching of the gate dielectric layer 102, and the second sacrificial layer 106B is formed of a material that has a high etching selectivity from the etching of the first sacrificial layer 106A. The sacrificial layer 106A may be formed of TiN, silicon-doped TiN (TiSiN), TaN, or the like, and may be formed by a deposition process such as ALD or CVD. The sacrificial layer 106B may be formed of amorphous silicon, polysilicon, silicon nitride, the like, or combinations thereof, and may be formed by a deposition process such as CVD or ALD. In some embodiments, the sacrificial layers 106A, 106B are formed by different deposition processes.

As noted above, the initial spacing distance $D_3$ (see FIG. 15A) between the fins 62 is small, and bending of the fins 62 can occur when the recesses 100 are formed, which further decreases the spacing distance $D_4$ (see FIG. 15A). The risk of pinch-off during deposition of the sacrificial layers 106A, 106B is thus high. Specifically, the risk of pinch-off is high when CVD is used to deposit the sacrificial layers 106A, 106B. As discussed further below, the sacrificial layer 106B is deposited with a CVD process that helps avoid or reduce the risk of pinch-off caused by the small spacing distance of the fins 62.

In some embodiments, the sacrificial layer 106A is a layer of TiSiN deposited with ALD. Depositing the sacrificial layer 106A with ALD allows it to have a high degree of conformality, with the thickness $T_3$ of its vertical portions being similar to the thickness $T_4$ of its horizontal portions. Depositing the sacrificial layer 106A with ALD also allows it to have a small thickness. The thickness $T_3$ and the thickness $T_4$ can each be in the range of about 0.5 nm to about 2.5 nm.

In some embodiments, the sacrificial layer 106B is a layer of amorphous silicon deposited with a self-inhibiting CVD process, which has a slow deposition rate. The self-inhibiting CVD process is performed by placing the substrate 50 in a deposition chamber, dispensing a self-limiting source precursor into the deposition chamber, and then dispensing a self-reacting source precursor into the deposition chamber. The recesses 100 (e.g., the surfaces of the gate dielectric layer 102) are exposed to the self-limiting source precursor and then the self-reacting source precursor.

The self-limiting source precursor and the self-reacting source precursor both react to form the material (e.g., silicon) of the sacrificial layer 106B. The self-reacting source precursor can react with itself in a CVD process to form the material (e.g., silicon) of the sacrificial layer 106B. Acceptable self-reacting source precursors for silicon include binary silicon-hydrogen compound silanes such as silane ($SiH_4$), disilane ($Si_2H_6$), and the like. The self-limiting source precursor can be used to deposit a highly conformal layer of the material (e.g., silicon) of the sacrificial layer 106B, and can react with the self-reacting source precursor in a CVD process, but cannot react with itself in the CVD process. Acceptable self-limiting source precursors for silicon include aminosilanes, such as dimethylaminosilane ($SiH_3[N(CH_3)_2]$, DMAS), ethylmethylaminosilane ($SiH_3[N(CH_3C_2H_5)]$, EMAS), diethylaminosilane ($SiH_3[N(C_2H_5)_2]$, DEAS), ethylisopropylaminosilane ($SiH_3[N(C_2H_5C_3H_7)]$, EIPAS), diisopropylaminosilane ($SiH_3[N(C_3H_7)_2]$, DIPAS), and the like.

A first pulse of the self-inhibiting CVD process is performed by dispensing the self-limiting source precursor into the deposition chamber. The self-limiting source precursor can be dispensed at a flow rate the range of about 50 sccm to about 1000 sccm and for a duration in the range of about 20 seconds to about 180 seconds. No self-reacting source precursor is dispensed during the dispensing of the self-limiting source precursor. The self-limiting source precursor is then purged from the deposition chamber.

The self-limiting source precursor (e.g., an aminosilane) includes $SiH_3$ groups, which readily react with dangling bonds at the surface of the sacrificial layer 106A to form a conformal initial layer of amorphous silicon during the first pulse. The $SiH_3$ groups in an aminosilane are bonded to nitrogen atoms. Although silanes also include $SiH_3$ groups, $SiH_3$ groups in silanes are bonded to other hydrogen atoms. $SiH_3$ groups can break away from nitrogen atoms (e.g., in an aminosilane) more easily than from hydrogen atoms (e.g., in a silane). Thus, dispensing the self-limiting source precursor in the first pulse may allow more $SiH_3$ groups to react with dangling bonds at the surface of the sacrificial layer 106A, increasing the conformality of the initial layer. Because the self-limiting source precursor cannot react with itself, the initial layer can be very thin, such as one monolayer thick.

A second pulse of the self-inhibiting CVD process is then performed by dispensing the self-reacting source precursor into the deposition chamber. The self-reacting source precursor can be dispensed at a flow rate the range of about 20 sccm to about 1000 sccm and for a duration in the range of about 10 minutes to about 50 minutes. The duration of the second pulse can be longer than the duration of the first pulse, such as from about 3.3% to about 150% longer than the first pulse. No self-limiting source precursor is dispensed during the dispensing of the self-reacting source precursor.

The self-reacting source precursor (e.g., a silane) also includes $SiH_3$ groups, which readily bond to the initial layer of amorphous silicon during the second pulse. Accordingly, a main layer of amorphous silicon is formed along the initial layer of amorphous silicon, creating an amorphous silicon layer with a high degree of conformality. The self-reacting source precursor repeatedly reacts with previously formed $SiH_3$ groups. The sacrificial layer 106B can thus be formed by dispensed the self-reacting source precursor until the sacrificial layer 106B is a desired thickness.

During the self-inhibiting CVD process, the deposition chamber can be maintained at a temperature in the range of about 300° C. to about 500° C. and at a pressure in the range of about 0.1 Torr to about 20 Torr. The deposition rate of the self-inhibiting CVD process can be controlled by controlling the temperature of the chamber during the first pulse and the second pulse. Specifically, performing deposition at a low temperature allows the self-inhibiting CVD process to have a low deposition rate. The deposition rate of the self-inhibiting CVD process can be in the range of about 0.5 Å/minute to about 2 Å/minute. Depositing the sacrificial layer 106B at a slow deposition rate also allows it to have a high degree of conformality, with the thickness $T_5$ of its vertical portions being equal to or slightly less than the thickness $T_6$ of its horizontal portions. For example, the thickness $T_5$ can be up to about 20% less than the thickness $T_6$. Forming the sacrificial layer 106B with a high degree of conformality helps avoid pinch-off of the sacrificial layer 106B at the apexes of the fins 62 during deposition. By avoiding pinch-off, a subsequently performed etching process for removing the sacrificial layer 106B can be performed with less over-etching, which decreases the risk of damage to the fins 62 or the gate dielectric layer 102. Performing the self-inhibiting CVD process at a temperature in the range described above allows the deposition rate to be sufficiently slow to avoid pinch-off. Performing the self-inhibiting CVD process at a temperature that is outside of the range described above may not allow the deposition rate to be sufficiently slow to avoid pinch-off.

The thickness of the sacrificial layer 106B can be controlled by controlling the deposition rate and the duration of the self-inhibiting CVD process. When the deposition rate is controlled to be in the range described above and the second pulse is performed for a duration in the range described above, the sacrificial layer 106B can have a small thickness. The thickness $T_5$ can be in the range of about 12 nm to about 35 nm and the thickness $T_6$ can be in the range of about 15 nm to about 35 nm. Forming the sacrificial layer 106B with a small thickness also helps avoid pinch-off at the apexes of the fins 62 during deposition. By avoiding pinch-off, a subsequently performed etching process for removing the sacrificial layer 106B can be performed with less over-etching, which decreases the risk of damage to the fins 62 or the gate dielectric layer 102. Performing the second pulse for a duration in the range described above allows the thickness of the sacrificial layer 106B to be sufficiently small to avoid pinch-off. Performing the second pulse for a duration outside of the range described above may not allow the thickness of the sacrificial layer 106B to be sufficiently small to avoid pinch-off.

The thickness of the sacrificial layer 106B is greater than the thickness of the sacrificial layer 106A. Further, as noted above, the sacrificial layers 106A, 106B are formed of different materials. Notably, the material of the sacrificial layer 106B (e.g., amorphous silicon) acts as a better oxygen barrier than the material of the sacrificial layer 106A (e.g., TiSiN). The sacrificial layer 106B can thus act as an additional protection layer during subsequent processing, as compared to only forming the sacrificial layer 106A.

After depositing the sacrificial layer 106B, the gate dielectric layer 102 is thermally treated to repair the defects 104. The thermal treatment can include annealing the gate dielectric layer 102. The anneal can be performed at a temperature in the range of about 600° C. to about 1100° C. and for a duration of up to about 1 minute. The anneal can be performed in an atmosphere of oxygen, nitrogen, argon, or the like, or can be performed in a vacuum. The thermal treatment may passivate oxygen vacancies in the gate dielectric layer 102 (such as with trace oxygen from the sacrificial layer 106A) and rearrange oxygen at the interface of the gate dielectric layer 102 and each of the fins 62, thus repairing the defects 104. Repairing the defects 104 can help improve the performance and reliability of the resulting FinFETs, such as by reducing charge build-up and scattering effects that can decrease current mobility in the channel regions 68. During the thermal treatment, the gate dielectric layer 102 is covered by the sacrificial layers 106A, 106B. The sacrificial layers 106A, 106B helps prevent undesirable modification of the material(s) of the gate dielectric layer 102 during the thermal treatment, such as undesirable thermal oxidation that may occur if the gate dielectric layer 102 were exposed during the thermal treatment. Because the sacrificial layer 106B is thicker than the sacrificial layer 106A and is formed of a material that acts as a better oxygen barrier than the material of the sacrificial layer 106A, undesirable modification of the material(s) of the gate dielectric layer 102 may be further reduced as compared to only forming the sacrificial layer 106A. As such, the material properties (e.g., relative permittivity) of the gate dielectric layer 102 can be similar before and after the thermal treatment.

Figure 18B:
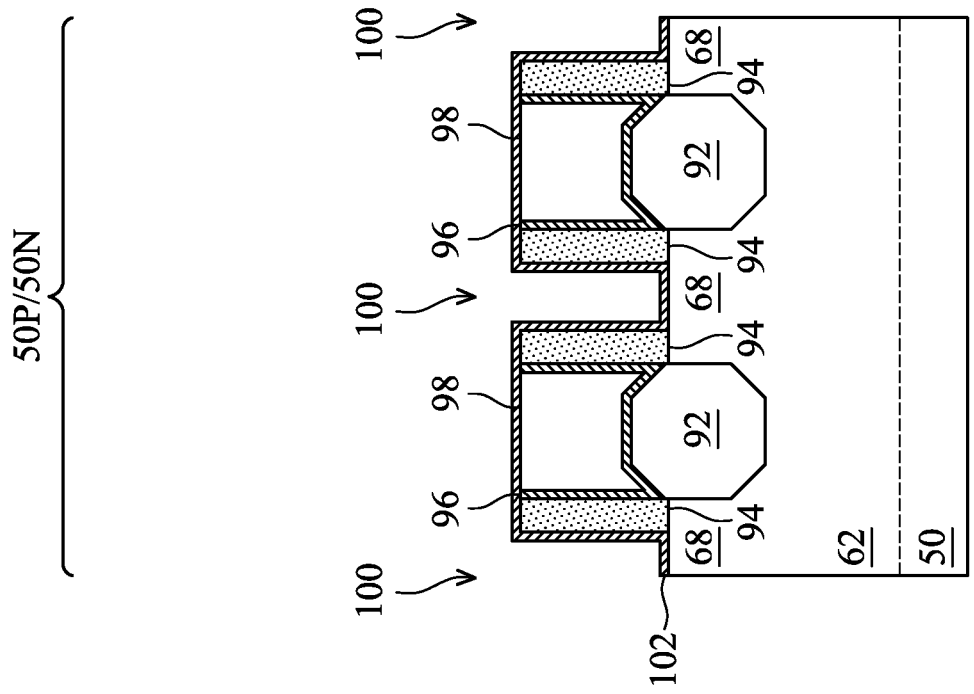
Figure 18A:
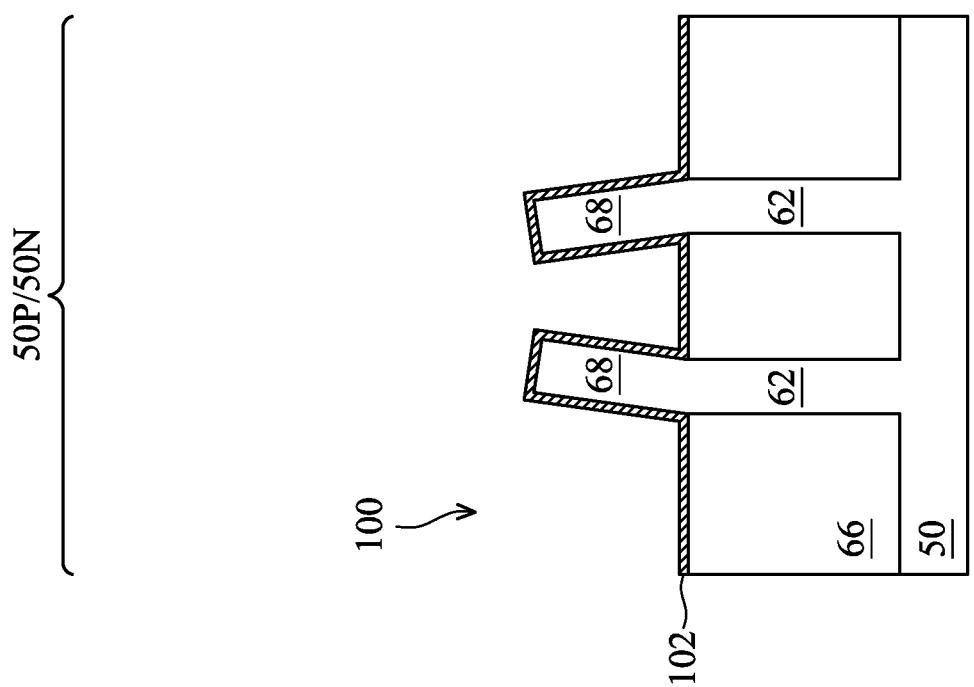

In FIGS. 18A and 18B, the sacrificial layers 106A, 106B are removed to expose the gate dielectric layer 102. The sacrificial layers 106A, 106B may be removed by acceptable etch process(es) that selectively etch the sacrificial layers 106A, 106B at a greater rate than the gate dielectric layer 102. The etch process(es) can include an anisotropic etch followed by an isotropic etch. Because the sacrificial layers 106A, 106B both have a high degree of conformality and a small thickness, the etch process(es) can be performed for a short duration and with a small amount of over-etching. For example, the sacrificial layer 106B (e.g., amorphous silicon) can be removed by a dry etch performed with fluorine for a duration in the range of about 10 seconds to about 120 seconds, and the sacrificial layer 106A (e.g., TiSiN) can then be removed by a wet etch performed with ammonium hydroxide ($NH_4OH$) for a duration in the range of about 30 seconds to about 180 seconds. Reducing the amount of over-etching when removing the sacrificial layers 106A, 106B can avoid or reduce damage to the gate dielectric layer 102 and/or the fins 62. Performing the etch process for a duration in the range described above allows damage to the gate dielectric layer 102 and/or the fins 62 from over-etching to be avoided. Performing the etch process for a duration outside of the range described above may not allow damage to the gate dielectric layer 102 and/or the fins 62 from over-etching to be avoided.

Figures 19A, 19B:
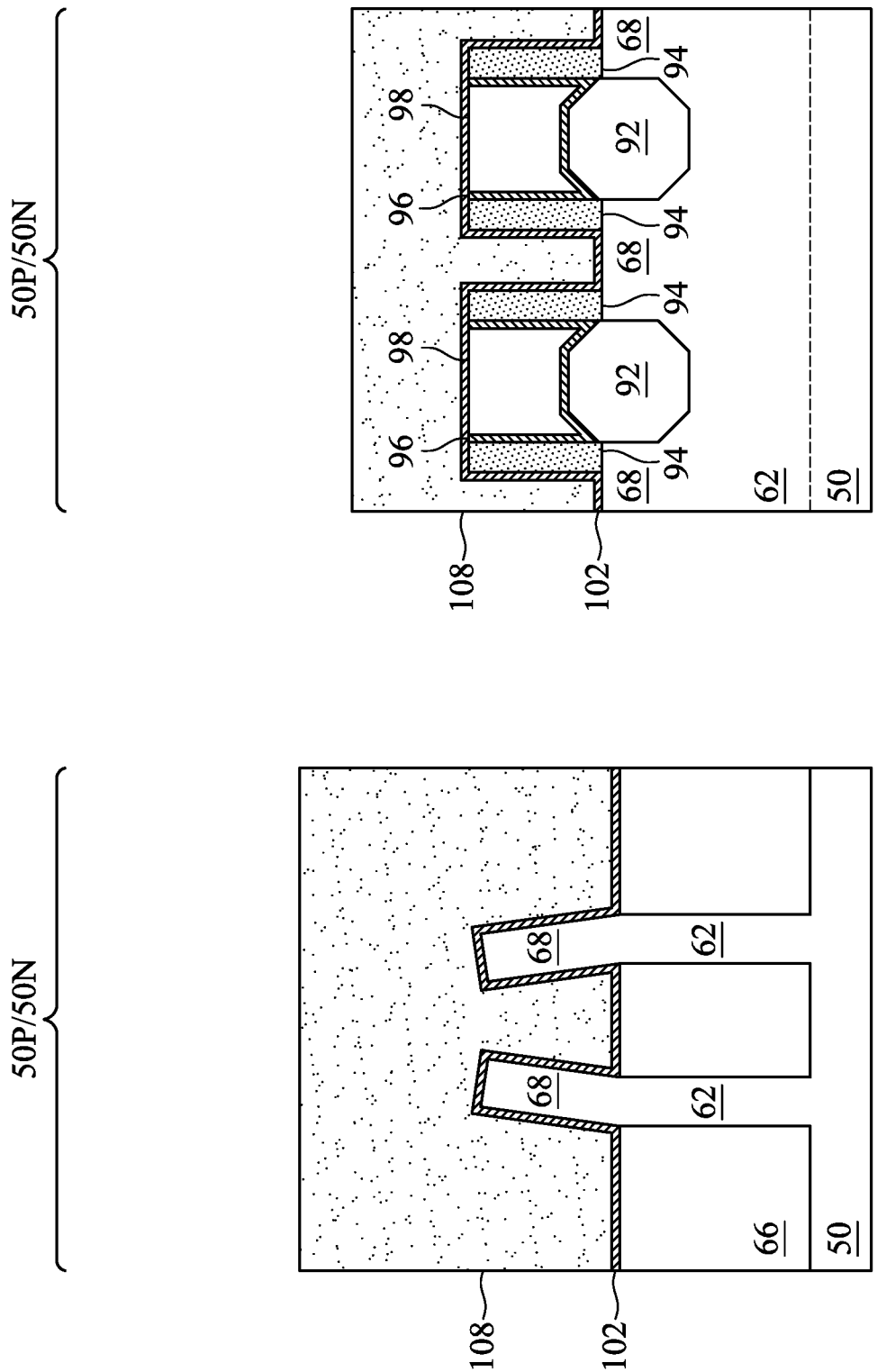

In FIGS. 19A and 19B, a gate electrode layer 108 is formed on the gate dielectric layer 102. The gate electrode layer 108 is deposited on the gate dielectric layer 102 and fills the remaining portions of the recesses 100. The gate electrode layer 108 may include a metal-containing material such as titanium nitride, titanium oxide, tantalum nitride, tantalum carbide, cobalt, ruthenium, aluminum, tungsten, combinations thereof, or multi-layers thereof. For example, although a single gate electrode layer 108 is illustrated, the gate electrode layer 108 may comprise any number of liner layers, any number of work function tuning layers, and a fill material.

Figure 20B:
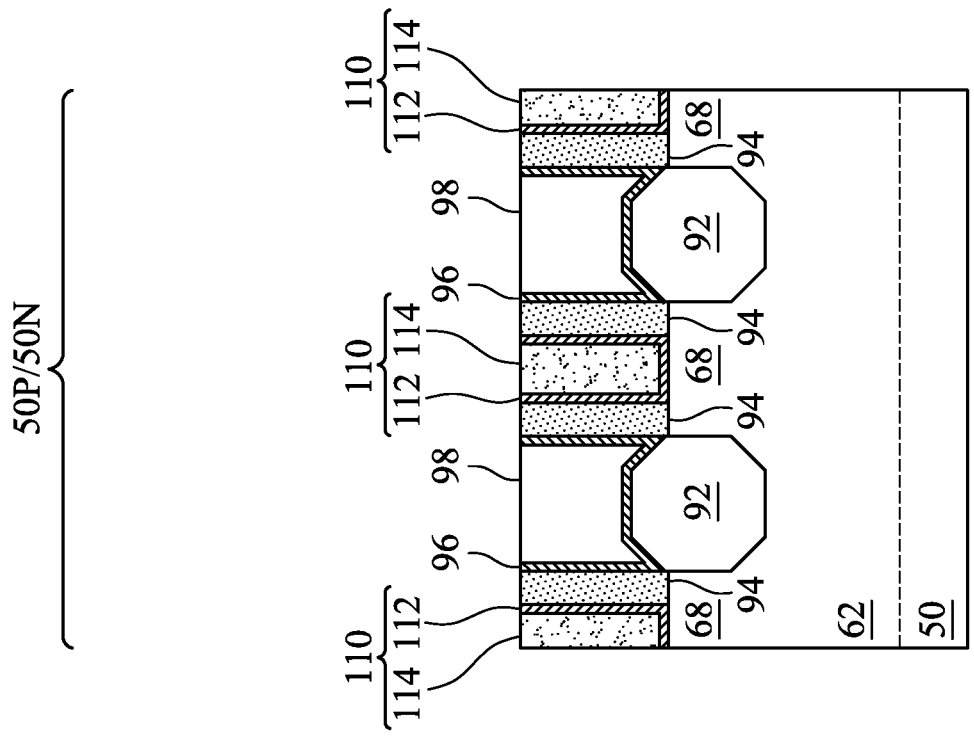
Figure 20A:
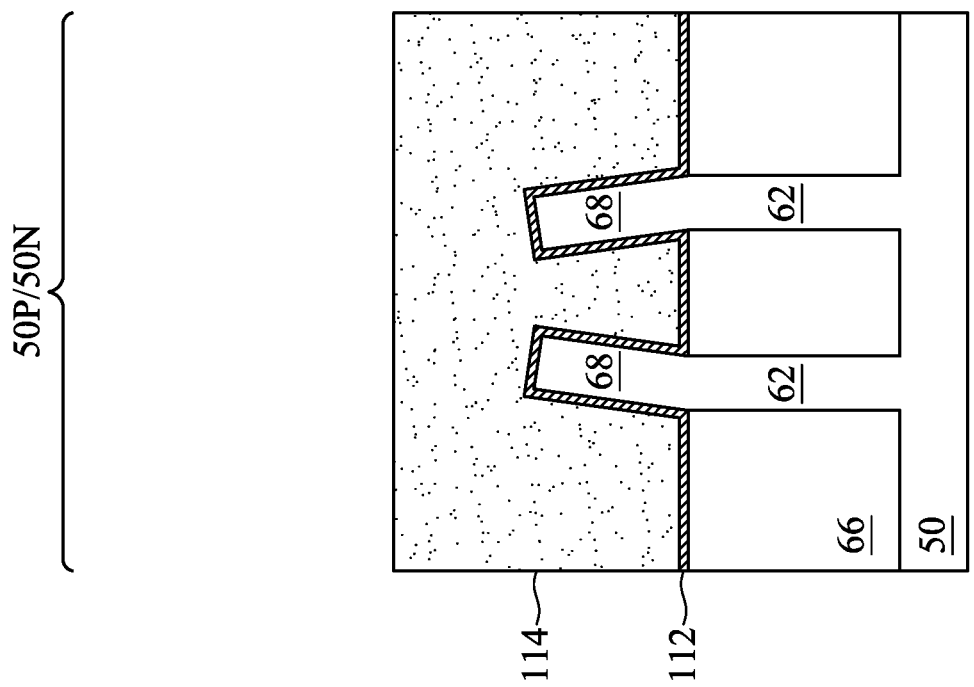

In FIGS. 20A and 20B, a planarization process, such as a CMP, is performed to remove the excess portions of the material(s) of the gate dielectric layer 102 and the material(s) of the gate electrode layer 108, which excess portions are over the top surfaces of the first ILD layer 98 and the gate spacers 94. The remaining portions of the material(s) of the gate dielectric layer 102 in the recesses 100 form gate dielectrics 112 for replacement gates of the resulting FinFETs. The remaining portions of the material(s) of the gate electrode layer 108 in the recesses 100 form gate electrodes 114 for the replacement gates of the resulting FinFETs. The gate dielectrics 112 and the gate electrodes 114 may be collectively referred to as gate structures 110 or "gate stacks." The gate structures 110 extend along sidewalls of the channel regions 68 of the fins 62.

The formation of the gate dielectrics 112 in the n-type region 50N and the p-type region 50P may occur simultaneously such that the gate dielectrics 112 in each region are formed from the same materials, and the formation of the gate electrodes 114 may occur simultaneously such that the gate electrodes 114 in each region are formed from the same materials. In some embodiments, the gate dielectrics 112 in each region may be formed by distinct processes, such that the gate dielectrics 112 may be different materials, and/or the gate electrodes 114 in each region may be formed by distinct processes, such that the gate electrodes 114 may be different materials. Various masking steps may be used to mask and expose appropriate regions when using distinct processes. For example, the gate dielectrics 112 and the gate electrodes 114 in the n-type region 50N may be formed by masking the p-type region 50P and performing the process described with respect to FIGS. 16A through 20B in the n-type region 50N. Likewise, the gate dielectrics 112 and the gate electrodes 114 in the p-type region 50P may be formed by masking the n-type region 50N and performing the process described with respect to FIGS. 16A through 20B in the p-type region 50P. In other words, the process described with respect to FIGS. 16A through 20B can be performed multiple times, e.g., once in the n-type region 50N and once in the p-type region 50P.

Figures 21A, 21B:
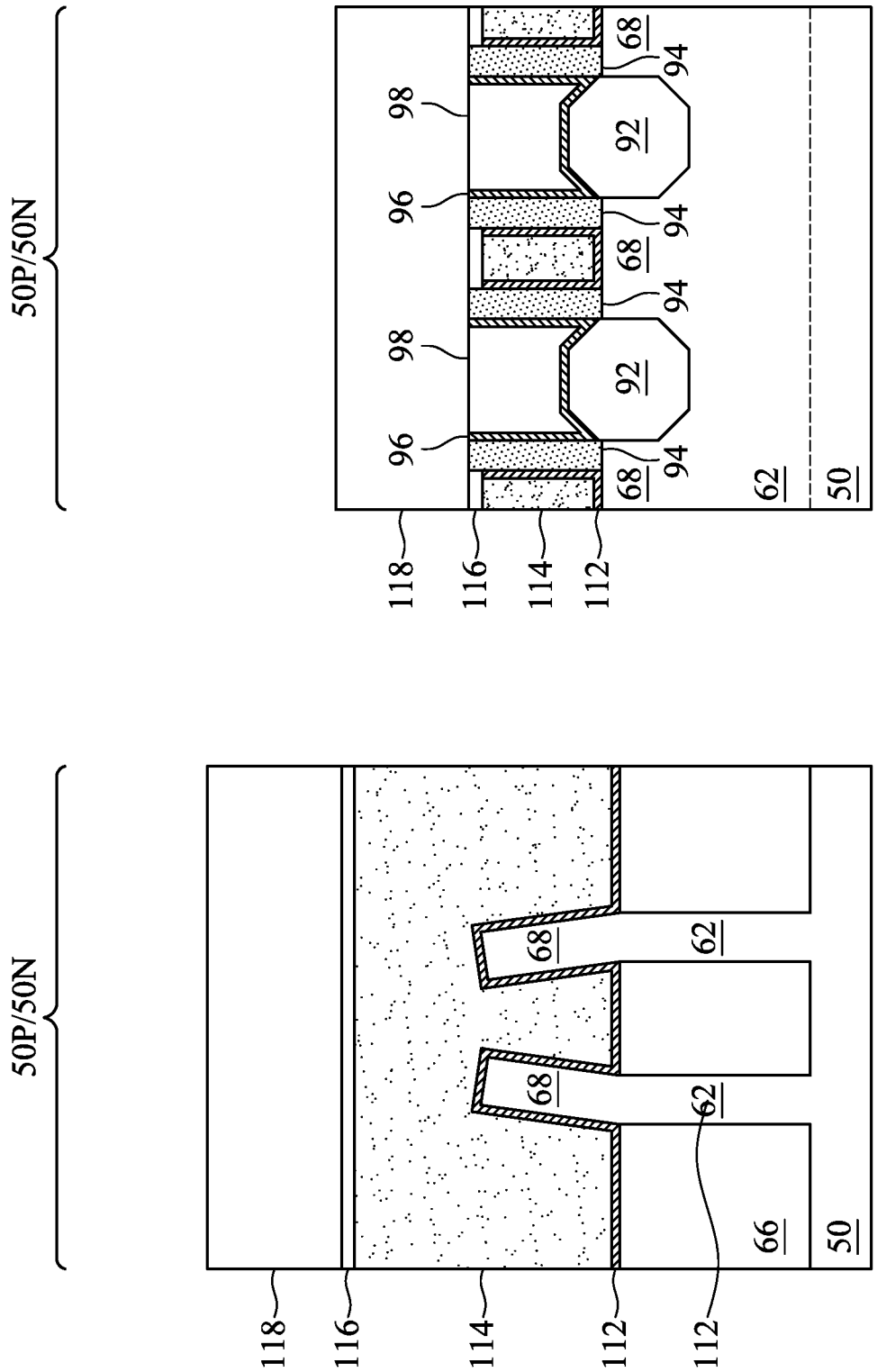

In FIGS. 21A and 21B, a second ILD layer 118 is deposited over the first ILD layer 98. In some embodiments, the second ILD layer 118 is a flowable film formed by a flowable CVD method. In some embodiments, the second ILD layer 118 is formed of a dielectric material such as PSG, BSG, BPSG, USG, or the like, and may be deposited by any suitable method, such as CVD and PECVD. In some embodiments, an etch stop layer is formed between the first ILD layer 98 and the second ILD layer 118.

In some embodiments, gate masks 116 are formed over respective gate stacks (including a gate dielectric 112 and a corresponding gate electrode 114). The gate masks 116 are disposed between opposing pairs of the gate spacers 94. In some embodiments, forming the gate masks 116 includes recessing the gate dielectrics 112 and the gate electrodes 114 so that recesses are formed between opposing pairs of the gate spacers 94. One or more layers of dielectric material, such as silicon nitride, silicon oxynitride, or the like, are filled in the recesses, and a planarization process is performed to remove excess portions of the dielectric material extending over the first ILD layer 98. The gate masks 116 comprise the remaining portions of the dielectric material in the recesses. Subsequently formed gate contacts penetrate through the second ILD layer 118 and the gate masks 116 to contact the top surfaces of the recessed gate electrodes 114.

Figures 22A, 22B:
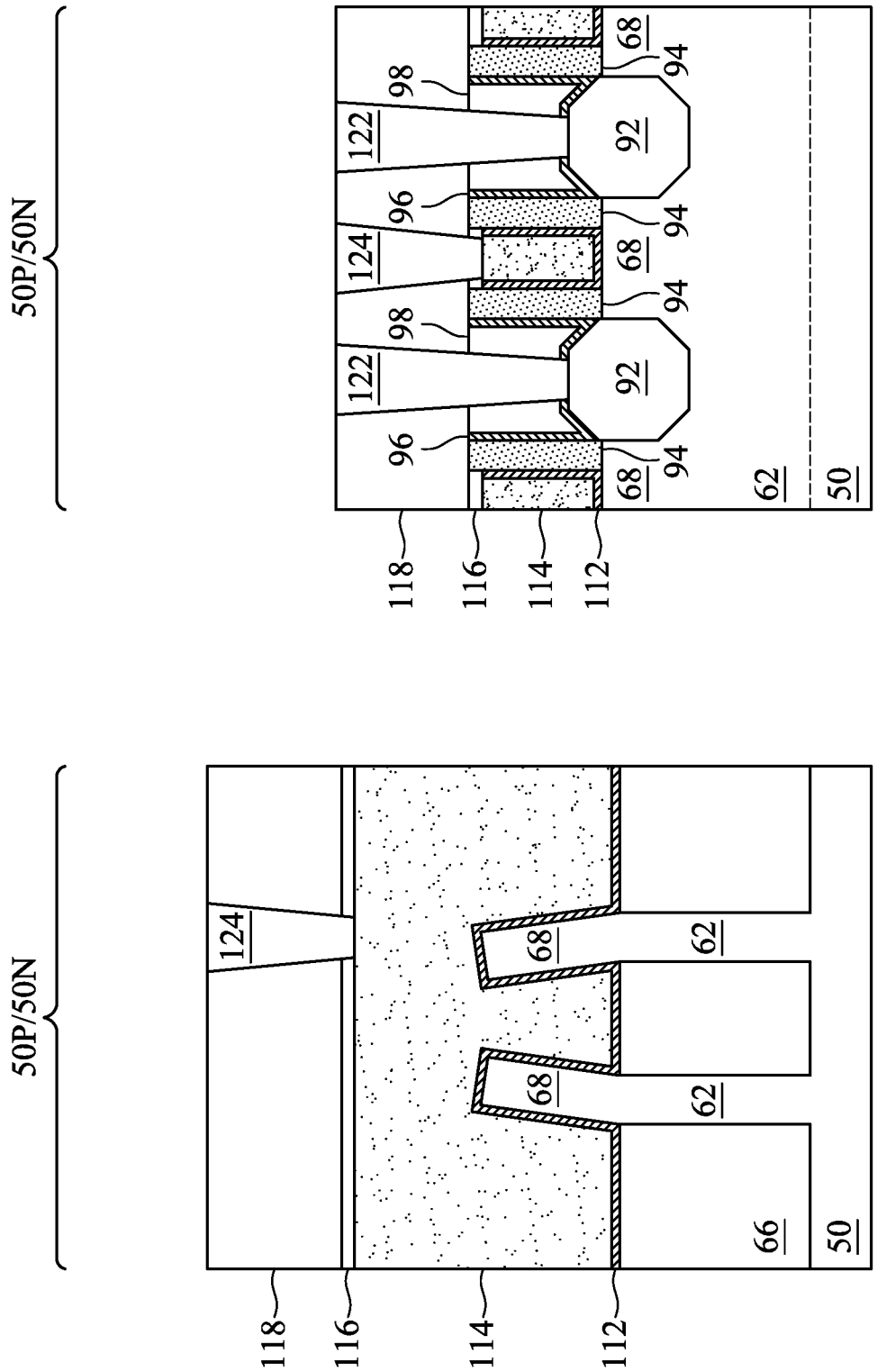

In FIGS. 22A and 22B, source/drain contacts 122 and gate contacts 124 are formed, respectively, to the epitaxial source/drain regions 92 and the gate electrodes 114. Openings for the source/drain contacts 122 are formed through the second ILD layer 118, the first ILD layer 98, and the CESL 96. Openings for the gate contacts 124 are formed through the second ILD layer 118 and the gate masks 116. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD layer 118. The remaining liner and conductive material form the source/drain contacts 122 and the gate contacts 124 in the openings. An anneal process may be performed to form a silicide at the interface between the epitaxial source/drain regions 92 and the source/drain contacts 122. The source/drain contacts 122 are physically and electrically coupled to the epitaxial source/drain regions 92, and the gate contacts 124 are physically and electrically coupled to the gate electrodes 114. The source/drain contacts 122 and the gate contacts 124 may be formed in different processes, or may be formed in the same process. Although shown as being formed in the same cross-sections, it should be appreciated that each of the source/drain contacts 122 and the gate contacts 124 may be formed in different cross-sections, which may avoid shorting of the contacts.

Embodiments may achieve advantages. Forming the fins 62 (see FIG. 5) with the spacing distance $D_3$ and the width $W_3$ discussed above allows for a good balance between integration density and manufacturing yield of the FinFETs. Protecting the gate dielectric layer 102 with the sacrificial layers 106A, 106B (see FIGS. 17A and 17B) while annealing the gate dielectric layer 102 allows defects 104 in the resulting gate stack to be cured without undesirable modification of the material(s) of the gate dielectric layer 102. Depositing the sacrificial layer 106B with a self-inhibiting CVD process performed with a self-limiting source precursor, such as an aminosilane, allows the sacrificial layer 106B to deposited with a high degree of conformality. Overetching during removal of the sacrificial layers 106A, 106B may thus be avoided, which can be particularly advantageous when the fins 62 are close together, such as when the fins 62 are formed with a small initial spacing distance $D_3$, or when bending of the fins 62 occurs during processing.

In an embodiment, a method includes: depositing a gate dielectric layer on a first fin and a second fin, the first fin and the second fin extending away from a substrate in a first direction, a distance between the first fin and the second fin decreasing along the first direction; depositing a sacrificial layer on the gate dielectric layer by exposing the gate dielectric layer to a self-limiting source precursor and a self-reacting source precursor, the self-limiting source precursor reacting to form an initial layer of a material of the sacrificial layer, the self-reacting source precursor reacting to form a main layer of the material of the sacrificial layer; annealing the gate dielectric layer while the sacrificial layer covers the gate dielectric layer; after annealing the gate dielectric layer, removing the sacrificial layer; and after removing the sacrificial layer, forming a gate electrode layer on the gate dielectric layer.

In some embodiments of the method, the self-reacting source precursor is a silane and the self-limiting source precursor is an aminosilane. In some embodiments of the method, the silane is a binary silicon-hydrogen compound silane, and the aminosilane is dimethylaminosilane, ethylmethylaminosilane, diethylaminosilane, ethylisopropylaminosilane, or diisopropylaminosilane. In some embodiments of the method, exposing the gate dielectric layer to the self-limiting source precursor and the self-reacting source precursor includes: placing the substrate in a deposition chamber; dispensing the self-limiting source precursor into the deposition chamber for a first duration; purging the self-limiting source precursor from the deposition chamber; and dispensing the self-reacting source precursor into the deposition chamber for a second duration, the second duration being greater than the first duration. In some embodiments of the method, the first duration is in a range of 20 seconds to 180 seconds, and the second duration is in a range of 10 minutes to 50 minutes. In some embodiments of the method, the gate dielectric layer is exposed to the self-reacting source precursor and the self-limiting source precursor at a temperature in a range of 300° C. to 500° C. In some embodiments of the method, the sacrificial layer is a silicon layer, the silicon layer having a first thickness along top surfaces of the first fin and the second fin, the silicon layer having a second thickness along sidewalls of the first fin and the second fin, the second thickness being up to 20% less than the first thickness. In some embodiments of the method, the first thickness is in a range of 12 nm to 35 nm and the second thickness is in a range of 15 nm to 35 nm. In some embodiments of the method, upper portions of the first fin and the second fin are separated by a first distance and lower portions of the first fin and the second fin are separated by a second distance, the first distance being in a range of 3.2 nm to 30 nm, the second distance being in a range of 8 nm to 30 nm. In some embodiments, the method further includes: growing an epitaxial source/drain region in the first fin and the second fin, the gate dielectric layer and the gate electrode layer disposed adjacent the epitaxial source/drain region. In some embodiments of the method, removing the sacrificial layer includes etching the sacrificial layer with a dry etch performed with fluorine for a duration in a range of 10 seconds to 120 seconds.

In an embodiment, a method includes: forming a first fin and a second fin extending from a substrate; forming a dummy dielectric on upper portions of the first fin and the second fin; growing an epitaxial source/drain region in the first fin and the second fin, the epitaxial source/drain region adjacent the dummy dielectric; removing the dummy dielectric from the first fin and the second fin, upper portions of the first fin and the second fin bending towards one another during the removing the dummy dielectric; depositing a gate dielectric layer on the upper portions of the first fin and the second fin; depositing a sacrificial layer on the gate dielectric layer, horizontal portions of the sacrificial layer having a first thickness, vertical portions of the sacrificial layer having a second thickness, the second thickness being up to 20% less than the first thickness; after depositing the sacrificial layer, annealing the gate dielectric layer; after annealing the gate dielectric layer, removing the sacrificial layer; and after removing the sacrificial layer, forming a gate electrode layer on the gate dielectric layer.

In some embodiments of the method, forming the first fin and the second fin includes: forming a mandrel over the substrate, the mandrel having a first width in a range of 10 nm to 15 nm; forming a first spacer and a second spacer adjacent the mandrel; removing the mandrel; and etching the first fin and the second fin in the substrate using the first spacer and the second spacer as an etching mask. In some embodiments of the method, depositing the sacrificial layer includes: performing a chemical vapor deposition process using a first precursor and a second precursor, the first precursor being a self-limiting source precursor for a material of the sacrificial layer, the second precursor being a self-reacting source precursor for the material of the sacrificial layer, where the self-reacting source precursor reacts with itself in the chemical vapor deposition process to form the material of the sacrificial layer, where the self-limiting source precursor does not react with itself in the chemical vapor deposition process. In some embodiments of the method, the first precursor is an aminosilane and the second precursor is a silane, the first precursor dispensed in a first pulse for a first duration during the chemical vapor deposition process, the second precursor dispensed in a second pulse for a second duration during the chemical vapor deposition process, the second duration being greater than the first duration. In some embodiments, the method further includes: forming an isolation region around lower portions of the first fin and the second fin, the upper portions of the first fin and the second fin disposed above the isolation region, where after removing the dummy dielectric, sidewalls of the upper portions of the first fin and the second fin form angles with sidewalls of the lower portions of the first fin and the second fin, the angles being up to 7 degrees. In some embodiments, the method further includes: forming an isolation region around lower portions of the first fin and the second fin, the upper portions of the first fin and the second fin disposed above the isolation region, where after removing the dummy dielectric, the upper portions of the first fin and the second fin are separated by a first distance and the lower portions of the first fin and the second fin are separated by a second distance, the first distance being up to 60% less than the second distance. In some embodiments of the method, annealing the gate dielectric layer repairs defects in the gate dielectric layer.

In an embodiment, a method includes: forming a dummy dielectric on a first fin and a second fin, the first fin and the second fin extending away from a substrate in a first direction; growing an epitaxial source/drain region in the first fin and the second fin, the epitaxial source/drain region adjacent the dummy dielectric; removing the dummy dielectric to form a recess exposing the first fin and the second fin, a distance between the first fin and the second fin being constant along the first direction before the removing, the distance between the first fin and the second fin decreasing along the first direction after the removing; depositing a gate dielectric layer in the recess; depositing a sacrificial layer on the gate dielectric layer by exposing the gate dielectric layer to a self-limiting source precursor and a self-reacting source precursor, the self-limiting source precursor reacting to form an initial layer of a material of the sacrificial layer, the self-reacting source precursor reacting to form a main layer of the material of the sacrificial layer, where the self-reacting source precursor reacts with itself, where the self-limiting source precursor does not react with itself; repairing defects in the gate dielectric layer while the sacrificial layer covers the gate dielectric layer; removing the sacrificial layer from the gate dielectric layer; and forming a gate electrode layer on the gate dielectric layer.

In some embodiments of the method, after removing the dummy dielectric, sidewalls of upper portions of the first fin and the second fin form angles with sidewalls of lower portions of the first fin and the second fin, the angles being up to 7 degrees.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    depositing a gate dielectric layer on a first fin and a second fin, the first fin and the second fin extending away from a substrate in a first direction, a distance between the first fin and the second fin decreasing along the first direction;
    depositing a sacrificial layer on the gate dielectric layer by exposing the gate dielectric layer to a self-limiting source precursor and a self-reacting source precursor, the self-limiting source precursor reacting to form an initial layer of a material of the sacrificial layer, the self-reacting source precursor reacting to form a main layer of the material of the sacrificial layer, wherein the self-reacting source precursor reacts with itself, wherein the self-limiting source precursor does not react with itself;
    annealing the gate dielectric layer while the sacrificial layer covers the gate dielectric layer;
    after annealing the gate dielectric layer, removing the sacrificial layer; and
    after removing the sacrificial layer, forming a gate electrode layer on the gate dielectric layer.

2. The method of claim 1, wherein the self-reacting source precursor is a silane and the self-limiting source precursor is an aminosilane.

3. The method of claim 2, wherein the silane is a binary silicon-hydrogen compound silane, and the aminosilane is dimethylaminosilane, ethylmethylaminosilane, diethylaminosilane, ethylisopropylaminosilane, or diisopropylaminosilane.

4. The method of claim 1, wherein exposing the gate dielectric layer to the self-limiting source precursor and the self-reacting source precursor comprises:
    placing the substrate in a deposition chamber;
    dispensing the self-limiting source precursor into the deposition chamber for a first duration;
    purging the self-limiting source precursor from the deposition chamber; and
    dispensing the self-reacting source precursor into the deposition chamber for a second duration, the second duration being greater than the first duration.

5. The method of claim 4, wherein the first duration is in a range of 20 seconds to 180 seconds, and the second duration is in a range of 10 minutes to 50 minutes.

6. The method of claim 5, wherein the gate dielectric layer is exposed to the self-reacting source precursor and the self-limiting source precursor at a temperature in a range of 300° C. to 500° C.

7. The method of claim 1, wherein the sacrificial layer is a silicon layer, the silicon layer having a first thickness along top surfaces of the first fin and the second fin, the silicon layer having a second thickness along sidewalls of the first fin and the second fin, the second thickness being up to 20% less than the first thickness.

8. The method of claim 7, wherein the second thickness is in a range of 12 nm to 35 nm and the first thickness is in a range of 15 nm to 35 nm.

9. The method of claim 1, wherein upper portions of the first fin and the second fin are separated by a first distance and lower portions of the first fin and the second fin are separated by a second distance, the first distance being in a range of 3.2 nm to 30 nm, the second distance being in a range of 8 nm to 30 nm.

10. The method of claim 1 further comprising:
growing an epitaxial source/drain region in the first fin and the second fin, the gate dielectric layer and the gate electrode layer disposed adjacent the epitaxial source/drain region.

11. The method of claim 1, wherein removing the sacrificial layer comprises etching the sacrificial layer with a dry etch performed with fluorine for a duration in a range of 10 seconds to 120 seconds.

12. A method comprising:
forming a first fin and a second fin extending from a substrate;
forming a dummy dielectric on upper portions of the first fin and the second fin;
growing an epitaxial source/drain region in the first fin and the second fin, the epitaxial source/drain region adjacent the dummy dielectric;
removing the dummy dielectric from the first fin and the second fin, upper portions of the first fin and the second fin bending towards one another during the removing the dummy dielectric;
depositing a gate dielectric layer on the upper portions of the first fin and the second fin;
depositing a sacrificial layer on the gate dielectric layer, horizontal portions of the sacrificial layer having a first thickness, vertical portions of the sacrificial layer having a second thickness, the second thickness being up to 20% less than the first thickness, wherein depositing the sacrificial layer comprises performing a chemical vapor deposition process using a first precursor and a second precursor, the first precursor being a self-limiting source precursor for a material of the sacrificial layer, the second precursor being a self-reacting source precursor for the material of the sacrificial layer, wherein the self-reacting source precursor reacts with itself in the chemical vapor deposition process to form the material of the sacrificial layer, wherein the self-limiting source precursor does not react with itself in the chemical vapor deposition process;
after depositing the sacrificial layer, annealing the gate dielectric layer;
after annealing the gate dielectric layer, removing the sacrificial layer; and
after removing the sacrificial layer, forming a gate electrode layer on the gate dielectric layer.

13. The method of claim 12, wherein forming the first fin and the second fin comprises:
forming a mandrel over the substrate, the mandrel having a first width in a range of 10 nm to 15 nm;
forming a first spacer and a second spacer adjacent the mandrel;
removing the mandrel; and
etching the first fin and the second fin in the substrate using the first spacer and the second spacer as an etching mask.

14. The method of claim 12, wherein the first precursor is an aminosilane and the second precursor is a silane, the first precursor dispensed in a first pulse for a first duration during the chemical vapor deposition process, the second precursor dispensed in a second pulse for a second duration during the chemical vapor deposition process, the second duration being greater than the first duration.

15. The method of claim 12 further comprising:
forming an isolation region around lower portions of the first fin and the second fin, the upper portions of the first fin and the second fin disposed above the isolation region,
wherein after removing the dummy dielectric, sidewalls of the upper portions of the first fin and the second fin form angles with sidewalls of the lower portions of the first fin and the second fin, the angles being up to 7 degrees.

16. The method of claim 12 further comprising:
forming an isolation region around lower portions of the first fin and the second fin, the upper portions of the first fin and the second fin disposed above the isolation region,
wherein after removing the dummy dielectric, the upper portions of the first fin and the second fin are separated by a first distance and the lower portions of the first fin and the second fin are separated by a second distance, the first distance being up to 60% less than the second distance.

17. The method of claim 12, wherein annealing the gate dielectric layer repairs defects in the gate dielectric layer.

18. A method comprising:
forming a dummy dielectric on a first fin and a second fin, the first fin and the second fin extending away from a substrate in a first direction;
growing an epitaxial source/drain region in the first fin and the second fin, the epitaxial source/drain region adjacent the dummy dielectric;
removing the dummy dielectric to form a recess exposing the first fin and the second fin, a distance between the first fin and the second fin being constant along the first direction before the removing, the distance between the first fin and the second fin decreasing along the first direction after the removing;
depositing a gate dielectric layer in the recess;
depositing a sacrificial layer on the gate dielectric layer by exposing the gate dielectric layer to a self-limiting source precursor and a self-reacting source precursor, the self-limiting source precursor reacting to form an initial layer of a material of the sacrificial layer, the self-reacting source precursor reacting to form a main layer of the material of the sacrificial layer, wherein the self-reacting source precursor reacts with itself, wherein the self-limiting source precursor does not react with itself;
repairing defects in the gate dielectric layer while the sacrificial layer covers the gate dielectric layer;

removing the sacrificial layer from the gate dielectric layer; and forming a gate electrode layer on the gate dielectric layer.

19. The method of claim 18, wherein after removing the dummy dielectric, sidewalls of upper portions of the first fin and the second fin form angles with sidewalls of lower portions of the first fin and the second fin, the angles being up to 7 degrees.

20. The method of claim 18, wherein the self-reacting source precursor is a silane and the self-limiting source precursor is an aminosilane.

* * * * *